(12) United States Patent
Ogawa et al.

(10) Patent No.: US 11,696,006 B2
(45) Date of Patent: Jul. 4, 2023

(54) IMAGING DEVICE

(71) Applicant: Panasonic Intellectual Property Management Co., Ltd., Osaka (JP)

(72) Inventors: Tomohiko Ogawa, Osaka (JP); Keisuke Mase, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 333 days.

(21) Appl. No.: 17/079,888

(22) Filed: Oct. 26, 2020

(65) Prior Publication Data

US 2021/0289110 A1    Sep. 16, 2021

(30) Foreign Application Priority Data

Mar. 10, 2020   (JP) ................................. 2020-040843

(51) Int. Cl.
*H04N 23/52* (2023.01)
*H05K 1/02* (2006.01)
*H04N 23/51* (2023.01)
*H04N 23/54* (2023.01)

(52) U.S. Cl.
CPC ............. *H04N 23/52* (2023.01); *H04N 23/51* (2023.01); *H04N 23/54* (2023.01); *H05K 1/021* (2013.01); *H05K 1/0209* (2013.01)

(58) Field of Classification Search
CPC ............. H04N 5/2252; H04N 5/22521; H04N 5/2253; H05K 1/0203; H05K 1/0209; H05K 1/021; H05K 1/147
See application file for complete search history.

(56) References Cited

U.S. PATENT DOCUMENTS 10,356,892 B2 * 7/2019 Hamada ............... H05K 1/0209
10,809,486 B2 * 10/2020 Hosoe .................... H04N 23/60
(Continued)

FOREIGN PATENT DOCUMENTS

JP   2002-329991 A   11/2002
JP   2003-046828 A   2/2003
(Continued)

OTHER PUBLICATIONS

Japanese Office Action dated Jun. 23, 2020 for the corresponding Japanese Patent Application No. 2020-040843.
(Continued)

*Primary Examiner* — Amy R Hsu
(74) *Attorney, Agent, or Firm* — Renner, Otto, Boisselle & Sklar, LLP

(57) ABSTRACT

To achieve reductions in size and weight and a higher functionality of an imaging device, the imaging device comprises a first circuit board mounting a first heat-generating component for processing a signal from the imaging sensor, a first heat dissipation plate for transferring heat from the first heat-generating component to the housing; and a fan disposed adjacent to the first heat dissipation plate, air-cooling the first heat dissipation plate, wherein the fan is configured to take in the air in a rotation axis direction and discharges the air in an outer circumferential direction, and the discharged air is blown to heat dissipation fins of the heat sink of the first heat dissipation plate and discharged from the discharge port.

7 Claims, 19 Drawing Sheets

(56) References Cited

U.S. PATENT DOCUMENTS

| | | | | |
|---|---|---|---|---|
| 2006/0071325 A1* | 4/2006 | Tanaka | .................... | H01L 23/36 |
| | | | | 257/E23.101 |
| 2014/0055671 A1* | 2/2014 | Kawamura | .............. | H04N 5/64 |
| | | | | 348/374 |
| 2018/0263104 A1 | 9/2018 | Hamada | | |
| 2019/0239337 A1* | 8/2019 | Manninen | ............... | H01L 23/42 |

FOREIGN PATENT DOCUMENTS

| | | | |
|---|---|---|---|
| JP | 2003-318582 | A | 11/2003 |
| JP | 2004-104632 | A | 4/2004 |
| JP | 2010-213000 | A | 9/2010 |
| JP | 2014-045345 | A | 3/2014 |
| JP | 2015-002183 | A | 1/2015 |
| JP | 2015-204422 | A | 11/2015 |
| JP | 2018-098244 | A | 6/2018 |
| JP | 2018-148545 | A | 9/2018 |

OTHER PUBLICATIONS

Japanese Office Action dated Oct. 6, 2020 for the corresponding Japanese Patent Application No. 2020-040843.
Japanese Final Office Action corresponding application No. 2020-040843 dated Feb. 16, 2021.

* cited by examiner

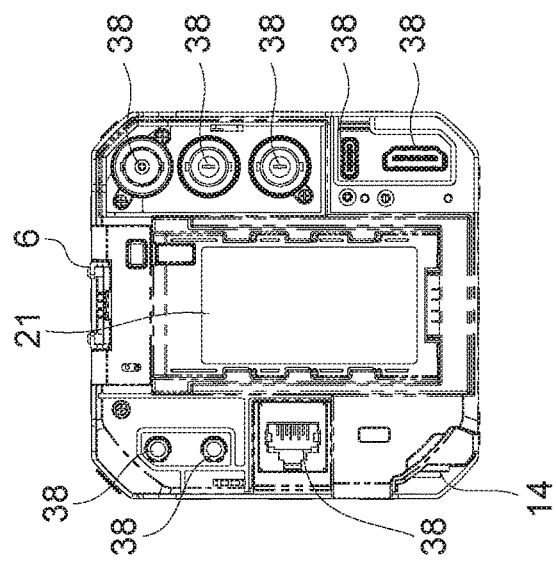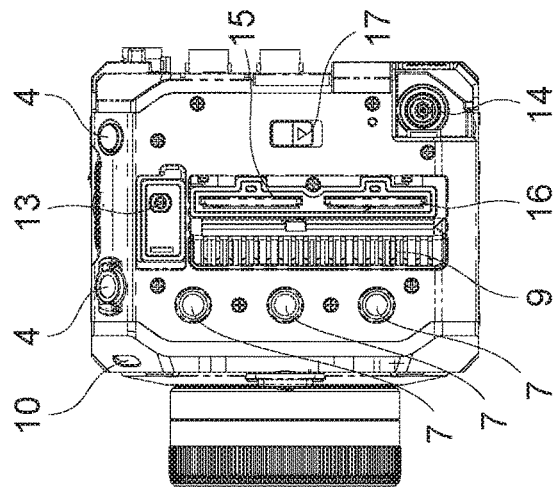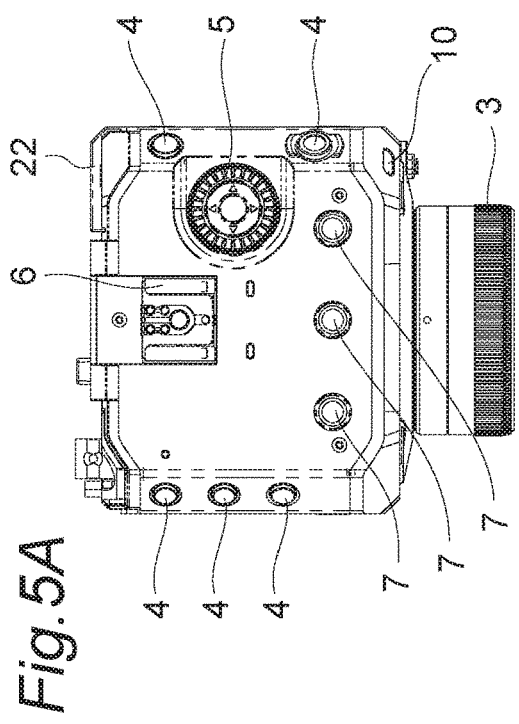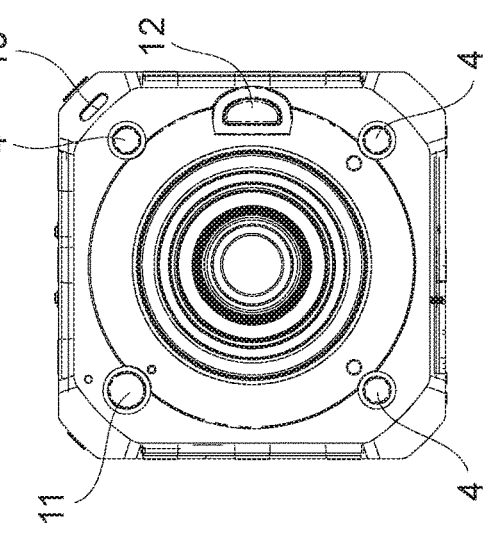

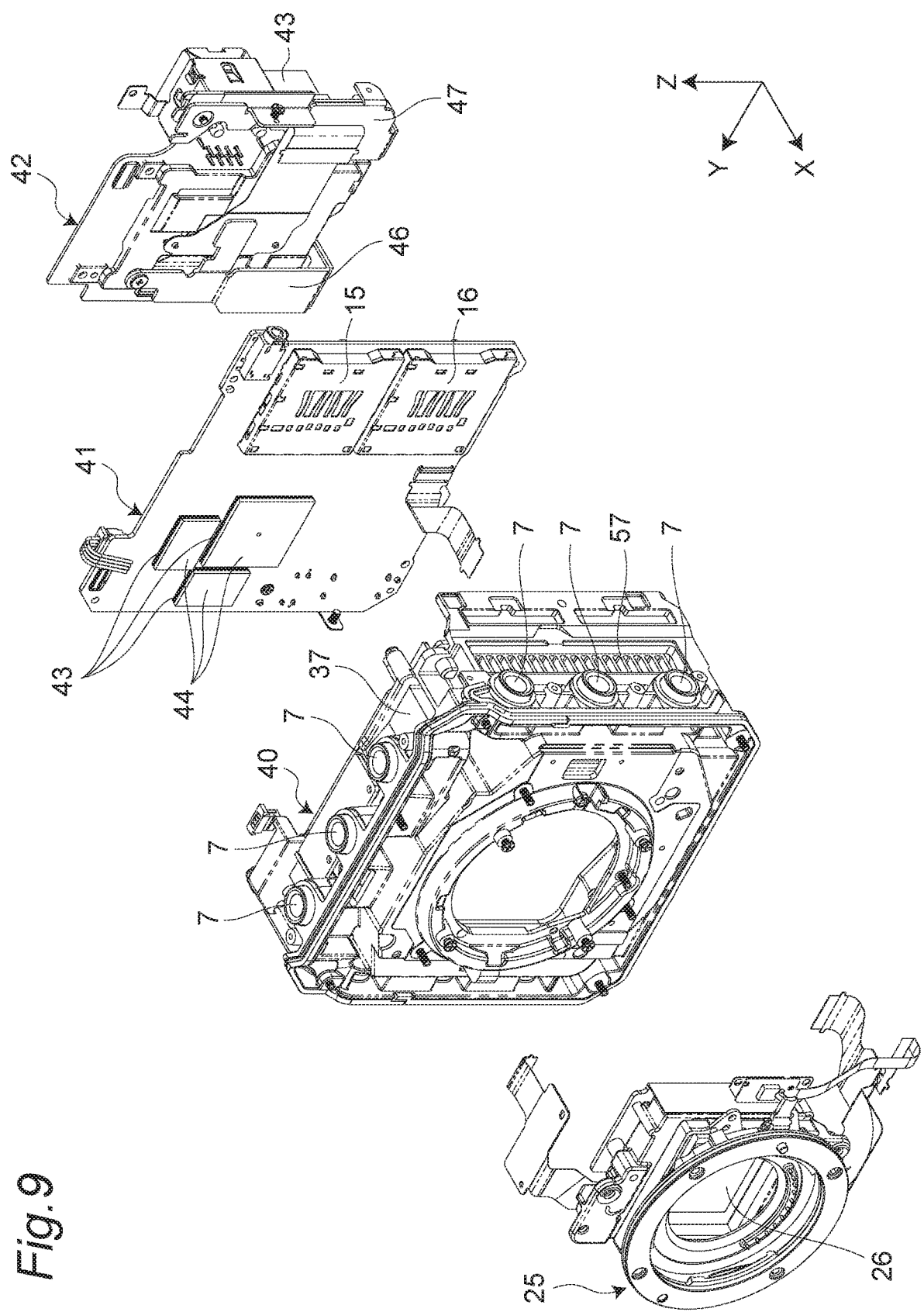

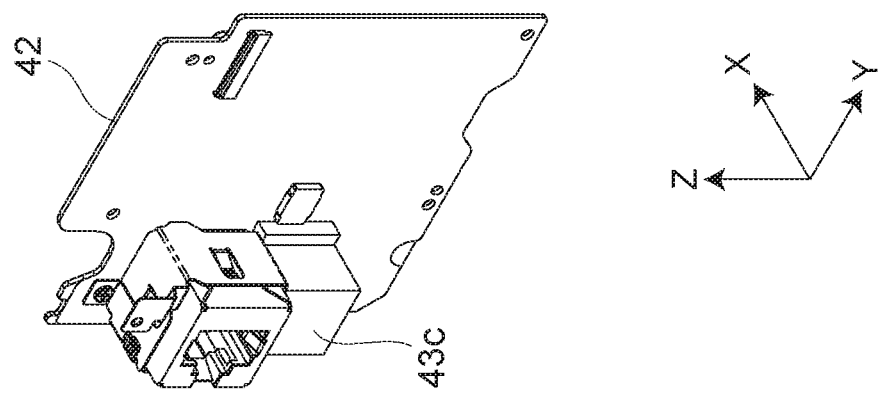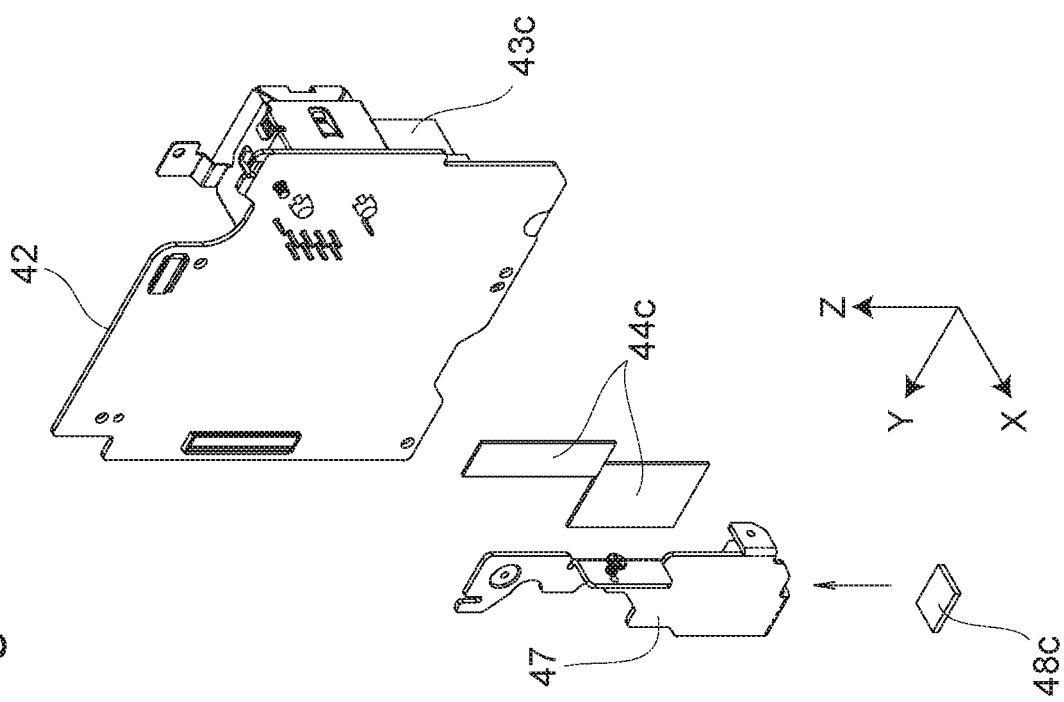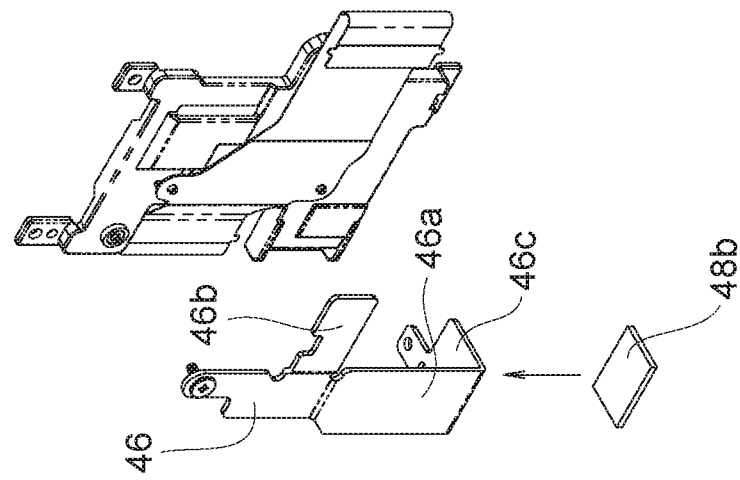

IMAGING DEVICE

RELATED APPLICATION

This application claims priority from Japanese Patent Application No. 2020-040843. The entire teachings of the above application are incorporated herein by reference.

BACKGROUND OF THE INVENTION

1. Field of the Invention

The present disclosure relates to an imaging device.

2. Description of the Related Art

In the field of electronic devices including imaging devices, reductions in size and weight are highly desired, and devices having high functionality are also demanded. Components constructing a device having high functionality tend to increase an amount of heat generation, and some of the components require cooling for fulfilling a desired function. Particularly, imaging devices are desired to have a smaller size, a lighter weight, a higher functionality in consideration of ease of handling, and a cooling mechanism for heat-generating components is indispensable for constituent components.

In a configuration proposed for a conventional imaging device, a fan and a duct are disposed to form a cooling flow path in the apparatus for cooling a heat-generating component so that a high functionality is exerted (see JP-A No. 2018-148545 and JP-A No. 2002-329991). In another proposed configuration, an imaging element acting as a heat-generating member is disposed and cooled in close contact with a heat dissipation plate having a larger area than a circuit board (see JP-A No. 2004-104632).

SUMMARY OF INVENTION

As described above, when a circuit board having multiple heat-generating components mounted thereon is cooled in the conventional imaging device, a cooling mechanism including a fan, a duct, a heat dissipation plate, etc. is disposed, and such a cooling mechanism occupies a large space inside the apparatus. As a result, the size of the apparatus increases, and this worsens a problem in terms of reductions in size and weight of the apparatus. Particularly, in the case of a configuration in which a mounting area of a circuit board is reduced for the reduction in size of a product and multiple circuit boards are disposed, heat-generating components are mounted on both sides of the circuit boards and the multiple circuit boards are arranged in a scattered manner. When multiple heat-generating components are mounted on multiple circuit boards in a scattered manner in this way for the purpose of reduction in size of an imaging device, the configuration provided with a conventional cooling mechanism results in the cooling mechanism occupying a larger space inside the apparatus and therefore has a problems to be solved from the viewpoint of the reductions in size and weight and the ease of handling of the apparatus.

As described above, to achieve reductions in size and weight and a higher functionality of an imaging device, the cooling mechanism disposed in the conventional imaging device still has room for improvement.

Therefore, an object of the present disclosure is to solve the problem and to provide an easy-to-handle imaging device capable of achieving reductions in size and weight and a higher functionality.

An imaging device according to an aspect of the present invention comprises:

a housing including an intake port and a discharge port and at least partially made up of a heat dissipation member;

an imaging sensor for converting light into an electrical signal disposed inside the housing;

a first circuit board disposed inside the housing and on which a first heat-generating component for processing a signal from the imaging sensor is mounted;

a first heat dissipation plate for transferring heat from the first heat-generating component to the housing; and a fan disposed adjacent to the first heat dissipation plate, taking in outside air through the intake port, air-cooling the first heat dissipation plate with the taken-in outside air, and blowing out the air from the discharge port, wherein the first heat dissipation plate is provided with a heat sink, wherein the fan takes in the air in a rotation axis direction and discharges the air in an outer circumferential direction, and wherein the discharged air is blown to heat dissipation fins of the heat sink and discharged from the discharge port.

The present disclosure can provide an imaging device capable of efficiently cooling each heat-generating component even in a configuration in which multiple heat-generating components are mounted on multiple circuit boards in a distributed manner and capable of achieving reductions in size and weight, a higher functionality, and ease of handling.

BRIEF DESCRIPTION OF THE DRAWINGS

FIG. 5A is a plan view (top view) of the camera of the first embodiment.

FIG. 5B is a front view of the camera of the first embodiment.

FIG. 5C is a right side view of the camera of the first embodiment.

FIG. 5D is a rear view of the camera of the first embodiment.

FIG. 9 is a perspective view of the camera main body unit shown in FIG. 8 further disassembled.

FIG. 11A is a perspective view schematically showing some of constituent elements on a sub-circuit board according to the first embodiment.

FIG. 11B is a perspective view schematically showing some of constituent elements on a sub-circuit board according to the first embodiment.

DETAILED DESCRIPTION OF THE INVENTION

Figure 1:
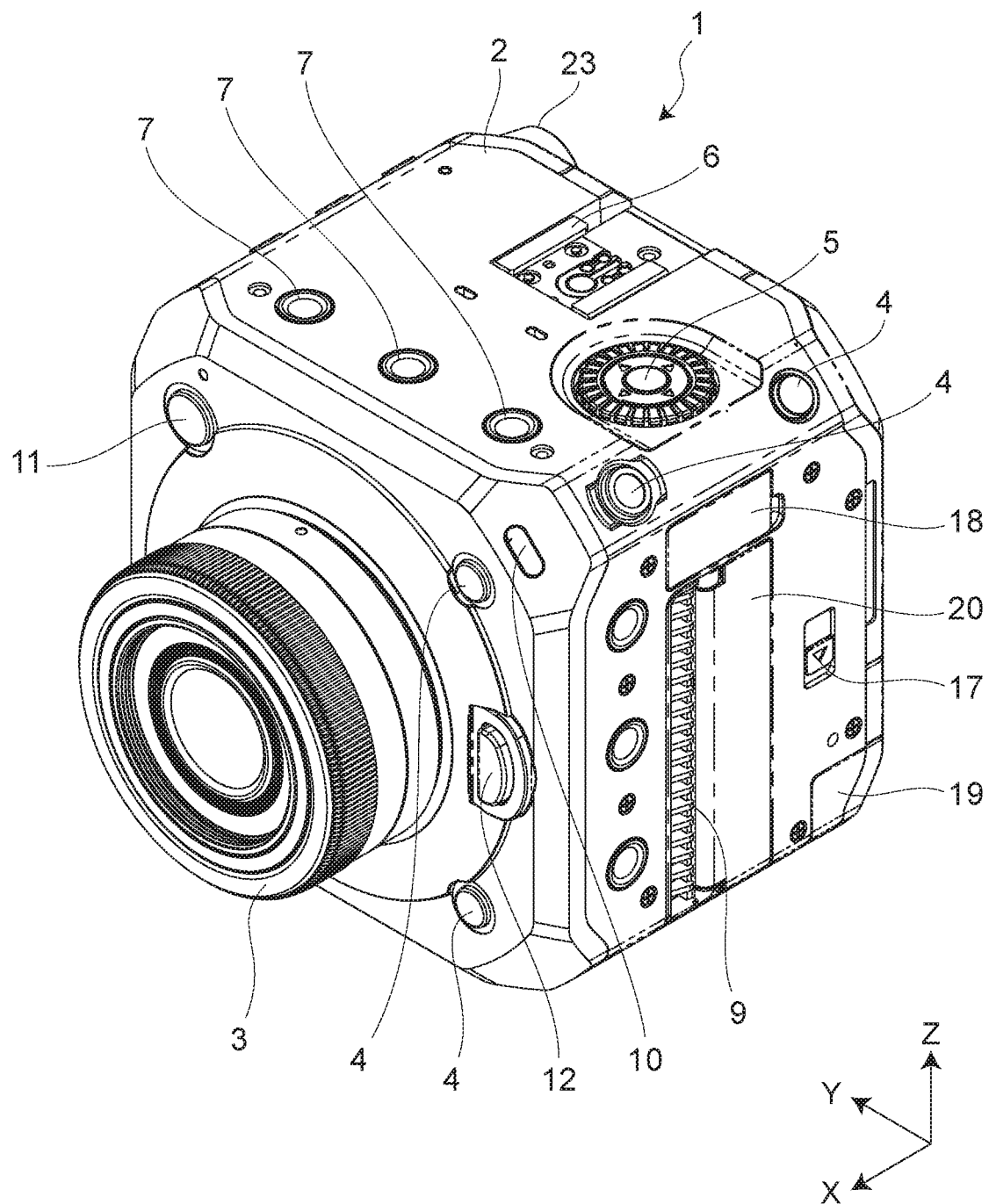
FIG. 1 is a perspective view of a camera of a first embodiment according to the present disclosure as viewed diagonally from above on the right front side.

A box-type single-lens reflex camera will hereinafter be described as a specific embodiment of an electronic device and an imaging device of the present disclosure with reference to the accompanying drawings. The electronic device and the imaging device of the present disclosure are not limited to the configuration of the camera described in the following embodiments and include the configurations of electronic devices and imaging devices based on techniques equivalent to the technical idea having the technical features described in the following embodiments.

Shapes, configurations, etc. described in the following embodiments are examples and the invention is not limited to the contents of the present disclosure. Among the constituent elements in the following embodiments, constituent elements not described in the independent claims describing the highest concept are described as optional constituent elements. In the embodiments, the same elements are denoted by the same reference numerals and may not be described.

Firstly, various configurations of an imaging device according to the present invention are described.

The imaging device according to a first aspect of the present invention may comprises:

a housing including an intake port and a discharge port and at least partially made up of a heat dissipation member;

an imaging sensor for converting light into an electrical signal disposed inside the housing;

a first circuit board disposed inside the housing and on which a first heat-generating component for processing a signal from the imaging sensor is mounted;

a first heat dissipation plate for transferring heat from the first heat-generating component to the housing; and a fan disposed adjacent to the first heat dissipation plate, taking in outside air through the intake port, air-cooling the first heat dissipation plate with the taken-in outside air, and blowing out the air from the discharge port, wherein the first heat dissipation plate is provided with a heat sink, wherein the fan takes in the air in a rotation axis direction and discharges the air in an outer circumferential direction, and wherein the discharged air is blown to heat dissipation fins of the heat sink and discharged from the discharge port.

The imaging device according to a second aspect of the present invention may be configured such that, in the configuration of the first aspect, the intake port, a fan discharge port of the fan, the heat dissipation fins of the heat sink, and the discharge port are linearly arranged in a direction orthogonal to the rotation axis of the fan so that the air taken in from the intake port is linearly discharged toward the discharge port inside the housing.

The imaging device according to a third aspect of the present invention may be configured to comprise, in the configuration of the first aspect, a second heat-generating component mounted on the first circuit board and mounted on a surface different from the first heat-generating component, and a second heat dissipation plate for transferring heat from the second heat-generating component to the housing.

The imaging device according to a fourth aspect of the present invention may be configured to comprise, in the configuration of the first aspect, a second circuit board disposed side by side with the first circuit board inside the housing and equipped with a third heat-generating component, and a third heat dissipation plate for transferring heat from the third heat-generating component to the housing.

The imaging device according to a fifth aspect of the present invention may comprises:

a housing including an intake port and a discharge port and at least partially made up of a heat dissipation member;

an imaging sensor for converting light into an electrical signal disposed inside the housing;

a first circuit board disposed inside the housing and on which a first heat-generating component for processing a signal from the imaging sensor is mounted;

a first heat dissipation plate for transferring heat from the first heat-generating component to the housing; and a fan disposed adjacent to the first heat dissipation plate, taking in outside air through the intake port, air-cooling the first heat dissipation plate with the taken-in outside air, and blowing out the air from the discharge port, wherein a partition plate of a fan duct cover is disposed between the fan and the imaging sensor, wherein the imaging sensor, the fan duct cover, the fan, and the first circuit board are arranged in this order, and wherein the first heat dissipation plate is disposed between the fan and the first circuit board.

The imaging device according to a sixth aspect of the present invention may comprises:

a housing including an intake port and a discharge port and at least partially made up of a heat dissipation member;

an imaging sensor for converting light into an electrical signal disposed inside the housing;

a first circuit board disposed inside the housing and on which a first heat-generating component for processing a signal from the imaging sensor is mounted;

a first heat dissipation plate for transferring heat from the first heat-generating component to the housing; and a fan disposed adjacent to the first heat dissipation plate, taking in outside air through the intake port, air-cooling the first heat dissipation plate with the taken-in outside air, and blowing out the air from the discharge port, wherein the imaging device is provided with an external cooling unit attached to at least a portion of the housing made up of the heat dissipation member and including a thermoelectric element serving as a heat-absorbing surface and a heat-generating surface when an electric current is applied, wherein air from the heat-absorbing surface is supplied to the intake port and cools at least a portion of the housing made up of the heat dissipation member, and wherein the air from the heat-generating surface is not supplied to the intake port.

The imaging device according to a seventh aspect of the present invention may be configured such that, in the configuration of the sixth aspect, the air from the heat-absorbing surface comes into contact with the surface of the housing provided with the intake port and the other surfaces constituting the housing.

The imaging device according to an eighth aspect of the present invention may be configured such that, in the configuration of the sixth aspect, the external cooling unit is configured not to cover a surface including various terminals arranged in the housing.

First Embodiment

Description will hereinafter be made of a box-type single-lens camera that is an imaging device of a first embodiment according to the present disclosure with reference to the drawings. The camera of the first embodiment is not provided with a monitor and has a configuration in which various signal processes such as setting control, drive control, and image display are performed in a separate control unit made up of an external personal computer etc. connected via a signal transmission cable. The camera of the first embodiment can be used in synchronization with multiple cameras having the same configuration and can process various images such as a panoramic image and a three-dimensional image with high definition. Furthermore, since the camera of the first embodiment is small and lightweight, has a remotely-controllable configuration, and therefore can be mounted on an unmanned aerial vehicle to perform a shooting operation.

Figure 2:
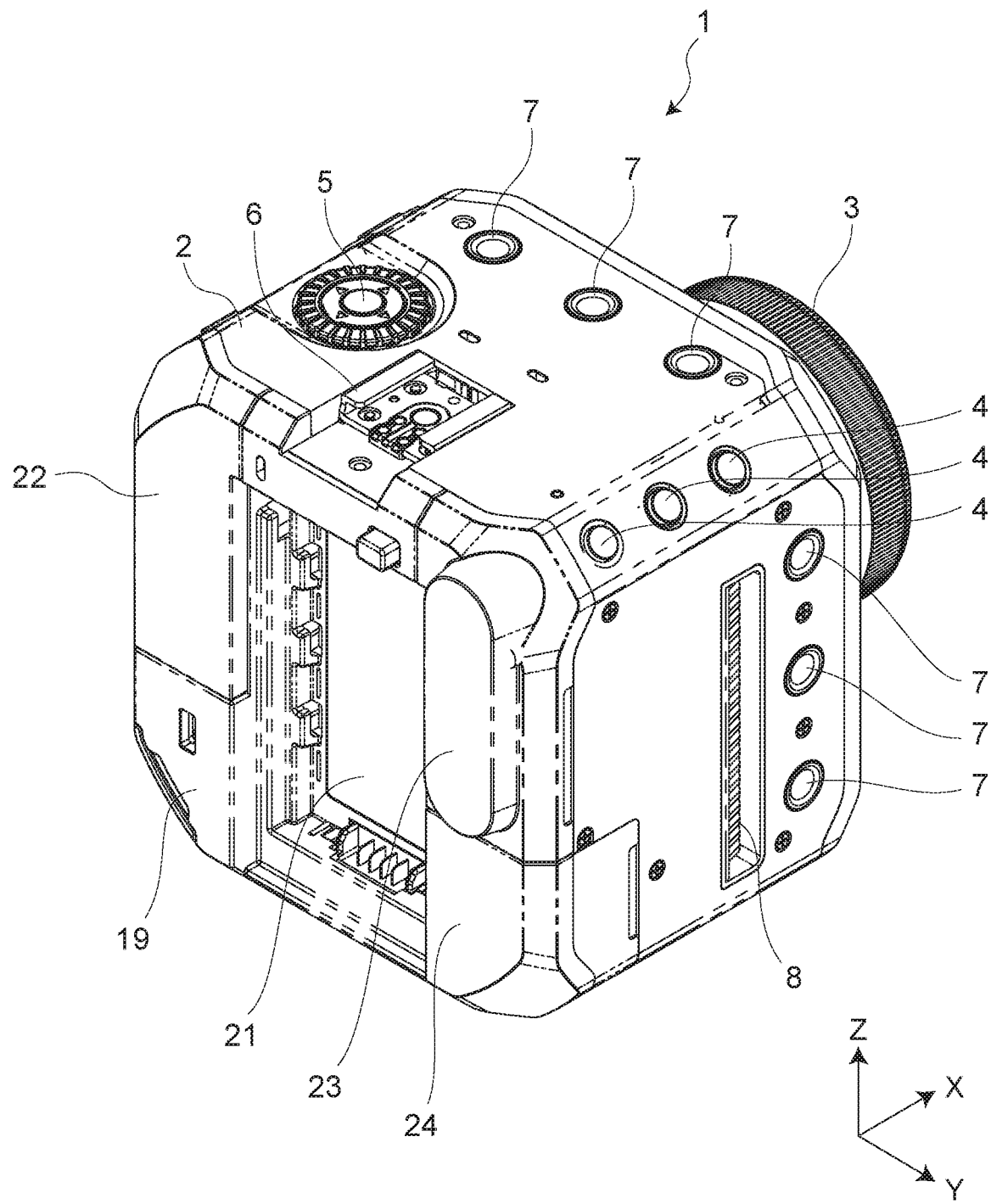
FIG. 2 is a perspective view of the camera of the first embodiment as viewed diagonally from above on the left rear side.
Figure 3:
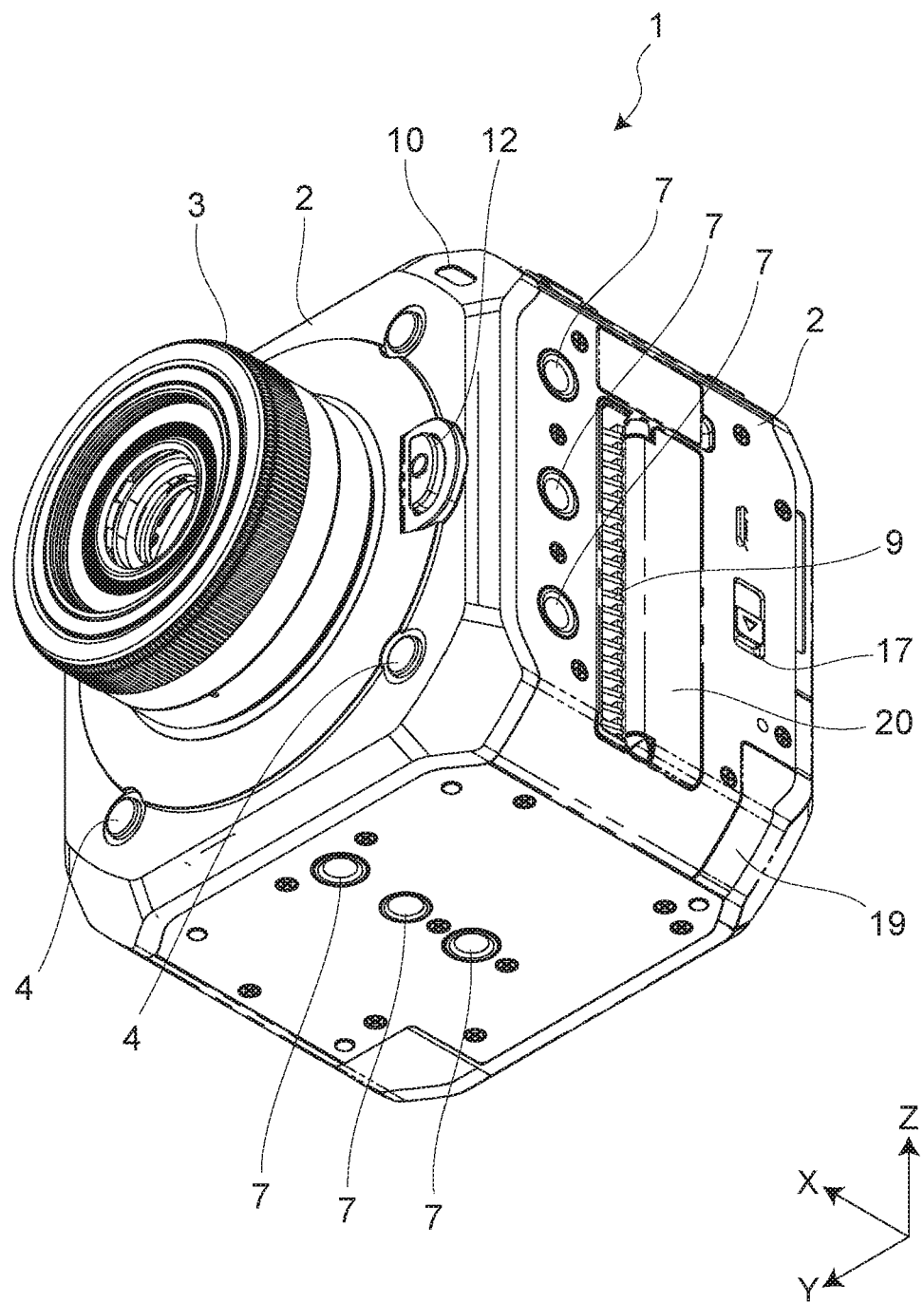
FIG. 3 is a perspective view of the camera of the first embodiment as viewed diagonally from below on the right front side.
Figure 4:
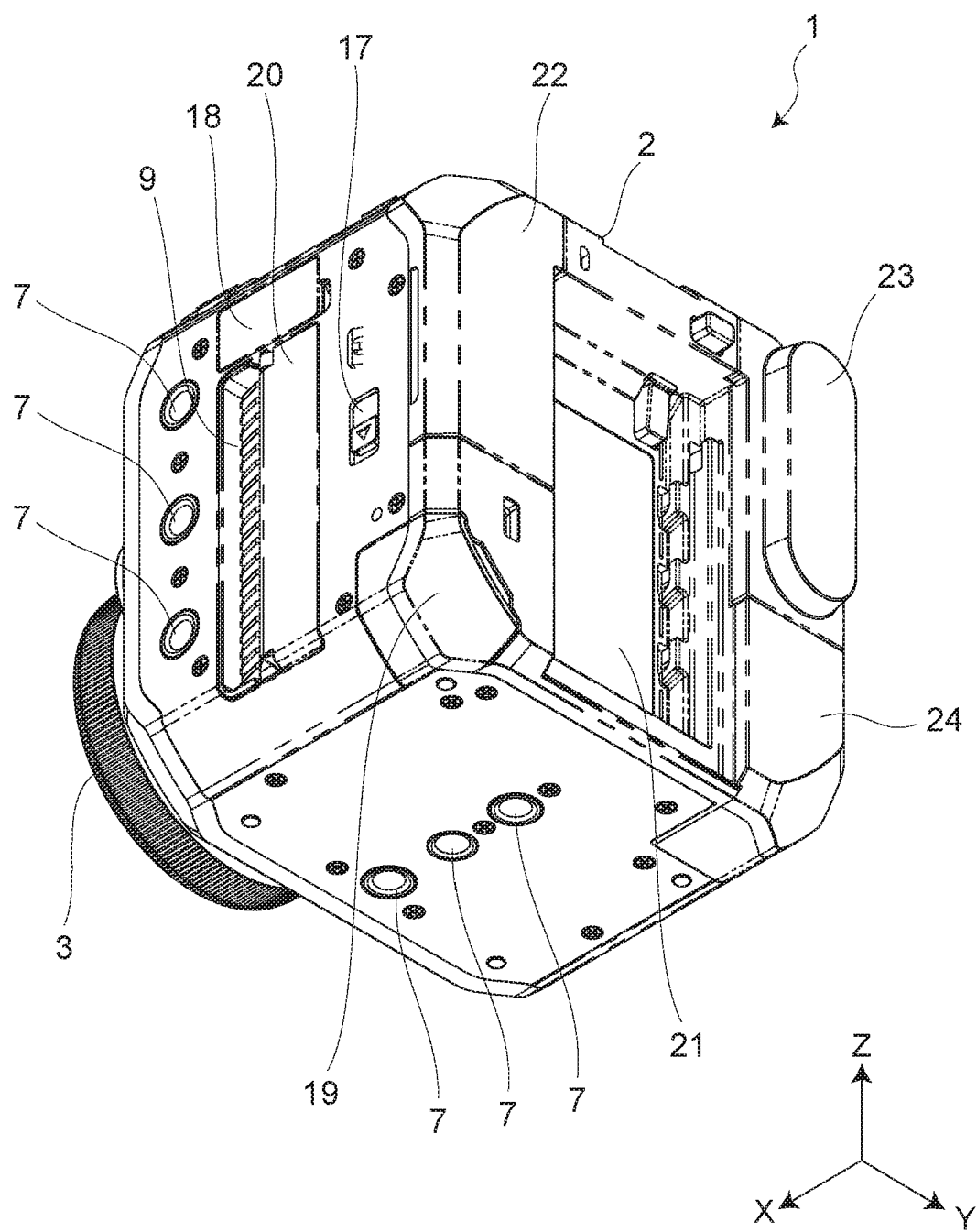
FIG. 4 is a perspective view of the camera of the first embodiment as viewed diagonally from below on the right rear side.

FIGS. 1 to 4 are perspective views of a box-type camera 1 of the first embodiment as viewed in four directions. FIG. 1 is a perspective view of the camera 1 as viewed diagonally from above on the right front side. FIG. 2 is a perspective view of the camera 1 as viewed diagonally from above on the left rear side. FIG. 3 is a perspective view of the camera 1 as viewed diagonally from below on the right front side. FIG. 4 is a perspective view of the camera 1 as viewed diagonally from below on the right rear side.

FIGS. 1 to 4 show an X axis, Y axis, and a Z axis orthogonal to each other for convenience, and a front-rear direction (X direction), a left-right direction (Y direction), and an up-down direction (Z direction) in the camera 1 of the first embodiment will be described by using the X axis, the Y axis, and the Z axis. In the description of the camera 1 of the first embodiment, the front side is defined as the side (object side) where an interchangeable lens 3 is mounted on a camera main body 2, and the right side and the left side is defined when the camera 1 is viewed from the front side. The X direction, the Y direction, or the Z direction simply described in the following description means an axial direction thereof and includes two opposite directions. The direction specified as the positive direction of the X axis is one direction from the rear side to the front side, the direction specified as the positive direction of the Y axis is one direction from the right side to the left side, and the direction specified as the positive direction of the Z axis is one direction from the lower side to the upper side.

As shown in FIGS. 1 to 4, the camera main body 2 has the interchangeable lens 3 mounted thereon and has a substantially hexahedral shape, which is a substantially cubic box shape in the first embodiment. The camera main body 2 is provided with multiple function buttons 4 and a jog dial 5 for performing various operations. The camera main body 2 is provided also with an accessory shoe 6 for mounting various accessories, input/output terminals for various electric signals such as control signals and image signals, and fixing means for fixing the camera main body 2, for example, screw holes (including engaging holes for stopping rotation) 7, etc. The screw holes 7 serving as the fixing means of the camera main body 2 of the first embodiment are disposed at multiple positions on four surfaces (top surface, bottom surface, left surface, right surface) on the upper, lower, left, and right sides of the camera main body 2. Therefore, any of the upper, lower, left, and right surfaces of the camera main body 2 can be attached to a frame for fixing, which widens an allowable range of shooting angle. The detailed configuration will be described later.

As shown in FIG. 1, the camera 1 of the first embodiment has a discharge port 9 formed as a vertically-long opening elongated in the up-down direction on the right side surface of the camera main body 2. As shown in FIG. 2, an intake port 8 is formed as a vertically-long opening elongated in the up-down direction on the left side surface of the camera main body 2. A fan 56 (see FIG. 13) is disposed inside the camera main body 2, and outside air taken in from the intake port 8 passes through a cooling flow path inside the camera main body 2 and is discharged from the discharge port 9. The camera main body 2 of the first embodiment has a forced cooling structure in which the air taken in from the intake port 8 is brought into direct contacts with a heat dissipation member etc. for cooling and a natural cooling structure in which a heat dissipation member comes into contact with the outside air for cooling. The detailed configurations of the forced cooling structure and the natural cooling structure will be described later.

[Appearance Configuration]

FIGS. 5A, 5B, 5C, and 5D are four views of the camera 1 of the first embodiment, which are a plan view (top view), a front view, a right side view, and a rear view, respectively.

As can be understood from each of FIGS. 5A to 5D, an external shape of a housing of the camera main body 2 in the first embodiment is a substantially cubic box shape formed by a hexahedron, and a boundary portion between two of the six principal surfaces constituting the hexahedron is formed by a slope oblique to each of the two surfaces. Additionally, eight corner portions each serving as a boundary of three principal surfaces are also formed by slopes oblique to each of the three surfaces.

As shown in the plan view of FIG. 5A, the multiple function buttons 4 having various functions are disposed on a slope portion that is the boundary between the top surface and the side surface of the camera 1. In the camera 1 of the first embodiment, the multiple function buttons 4 have functions of setting, adjusting, etc. for various functions in the camera 1, and the details of the functions will not be described.

The top surface of the camera 1 of the first embodiment is provided with the jog dial 5 for making various settings for the camera 1 and the accessory shoe 6 for mounting accessory components such as a microphone adapter and a flash. Additionally, the top surface is provided with multiple screw holes (female threads) 7 for fixing the camera 1 to another holding equipment, for example, a frame for fixing. In the configuration of the first embodiment, the three screw holes 7 are arranged in line at regular intervals in the Y direction (left-right direction).

As shown in the front view of FIG. 5B, the interchangeable lens 3 is mounted on the front side of the camera main body 2 at substantially the center of a substantially square shape. For a method of mounting the interchangeable lens 3 to the camera main body 2, a bayonet type is used so that the interchangeable lens 3 is rotated and fixed. However, the imaging device of the present disclosure is not limited to this mounting method, and other commonly used mounting methods may be applied. A power switch 11, a lens removal button 12, and multiple function buttons 4 are disposed on the front side of the camera main body 2, surrounding the interchangeable lens 3.

A tally light 10 displaying an operating status of the camera 1 is disposed at a corner portion that is a boundary of three principal surfaces and is arranged at a position visible in at least three directions. In the camera main body 2 in the first embodiment, the tally light 10 is arranged at the corner portion that is a boundary of three surfaces that are the front surface, the top surface, and the right side surface. Therefore, in the substantially hexahedral-shaped housing of the camera main body 2, the corner portion formed by three surfaces including the front surface for mounting the interchangeable lens 3 has a surface oblique to the three surfaces, and the tally light 10 is disposed at this corner portion. Since the camera 1 is provided with the multiple screw holes 7 serving as the fixing means on the top surface, the bottom surface, the left side surface, and the right side surface, the mounting position of the camera 1 can be changed so that the operating status of the camera 1 can be confirmed with a display state of the tally light 10 not only from the front side but also in any directions from the upper, lower, left, and right sides. Although the fixing means of the camera 1 in the first embodiment is disposed on the four surfaces, which are the top surface, the bottom surface, the left side surface, and the right side surface in this example, the present disclosure is not limited to this configuration and, in the substantially hexahedral-shaped housing of the main body 2, fixing members serving as the fixing means may be disposed on at least four surfaces for fixing the imaging device 1 to another member.

FIG. 5C shows the configuration of the right side surface of the camera 1 and shows a state in which terminal covers 18, 19 (see FIG. 1) are removed so that a control terminal 13 and a power input terminal 14 are exposed. In the state shown in the right side view of FIG. 5C, a card door 20 (see FIG. 1) is opened by operating a card door opening/closing button 17, so that card slots 15, 16 are exposed. As shown in FIG. 5C, the discharge port 9 having a vertically-long opening is formed on the right side surface of the camera 1, and two card slots 15, 16 are disposed adjacent to the discharge port 9. Memory cards are inserted into the card slots 15, 16.

On the right side surface of the camera 1, the power input terminal 14 is exposed by removing the terminal cover 19. As shown in FIGS. 5C and 5D, since the terminal cover 19 is disposed at the corner portion that is the boundary portion of the right side surface, the back surface, and the bottom surface, a power input cable (not shown) connected to the power input terminal 14 can be led out from any side of the right side surface, the back surface, and the bottom surface of the camera 1 by removing the terminal cover 19.

FIG. 5D shows the configuration of the back surface of the camera 1, and various connection terminals 38 for transmitting/receiving various signals to/from an external device are disposed. Examples of the various connection terminals 38 disposed on the back side of the camera 1 include SDI, Time Code, Gen Lock, USB, HDMI (registered trademark), Ethernet, and audio input/output. On the back surface of the camera 1, a battery mounting part 21 is formed as a concave space for mounting the battery.

The various connection terminals 38 are disposed on the back side of the camera 1 of the first embodiment as described above, and these connection terminals 38 are covered with terminal covers 22, 23, 24 when not in use so that a drip-proof state is achieved. All the terminal covers 18, 19, 22, 23, 24 disposed on the camera 1 have a configuration detachably attached to the camera main body 2 and ensure a drip-proof effect when attached.

As described above, in the camera 1 of the first embodiment, the terminal cover 19 of the power input terminal 14 is disposed in a lower right corner portion at the boundary of the back surface, the bottom surface, and the right side surface of the camera main body 2 (see FIGS. 1 and 3), and the terminal cover 24 of the connection terminal 38 for transmitting a signal to an external device is disposed in a lower left corner portion at the boundary of the back surface, the bottom surface, and the left side surface of the camera main body 2 (see FIG. 2). Specifically, the terminal covers 19, 24 of the left and right corner portions on the lower side of the back side of the camera 1 have a removable configuration. The terminal covers 19, 24 ensures connection spaces for various cables to the power input terminal 14 and the connection terminal 38. Therefore, by removing the terminal covers 19, 24, even when the multiple cameras 1 are arranged side by side, the power cables and the signal transmission cables connected to the power input terminals 14 of the respective cameras 1 can easily be connected without being affected by arrangement of the adjacent cameras 1.

Figure 6:
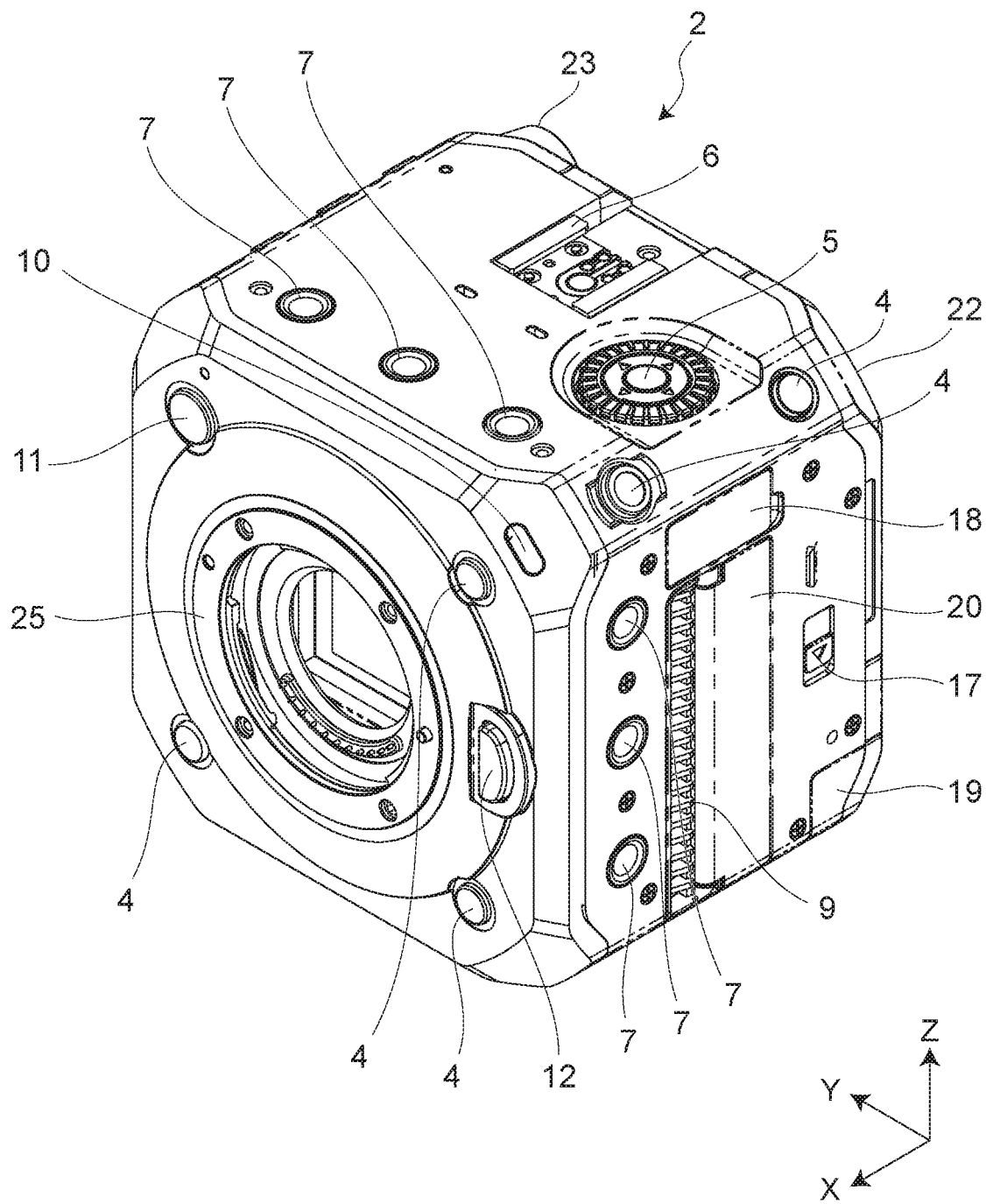
FIG. 6 is a perspective view showing a camera main body when an interchangeable lens is removed from the camera of the first embodiment.
Figure 7:
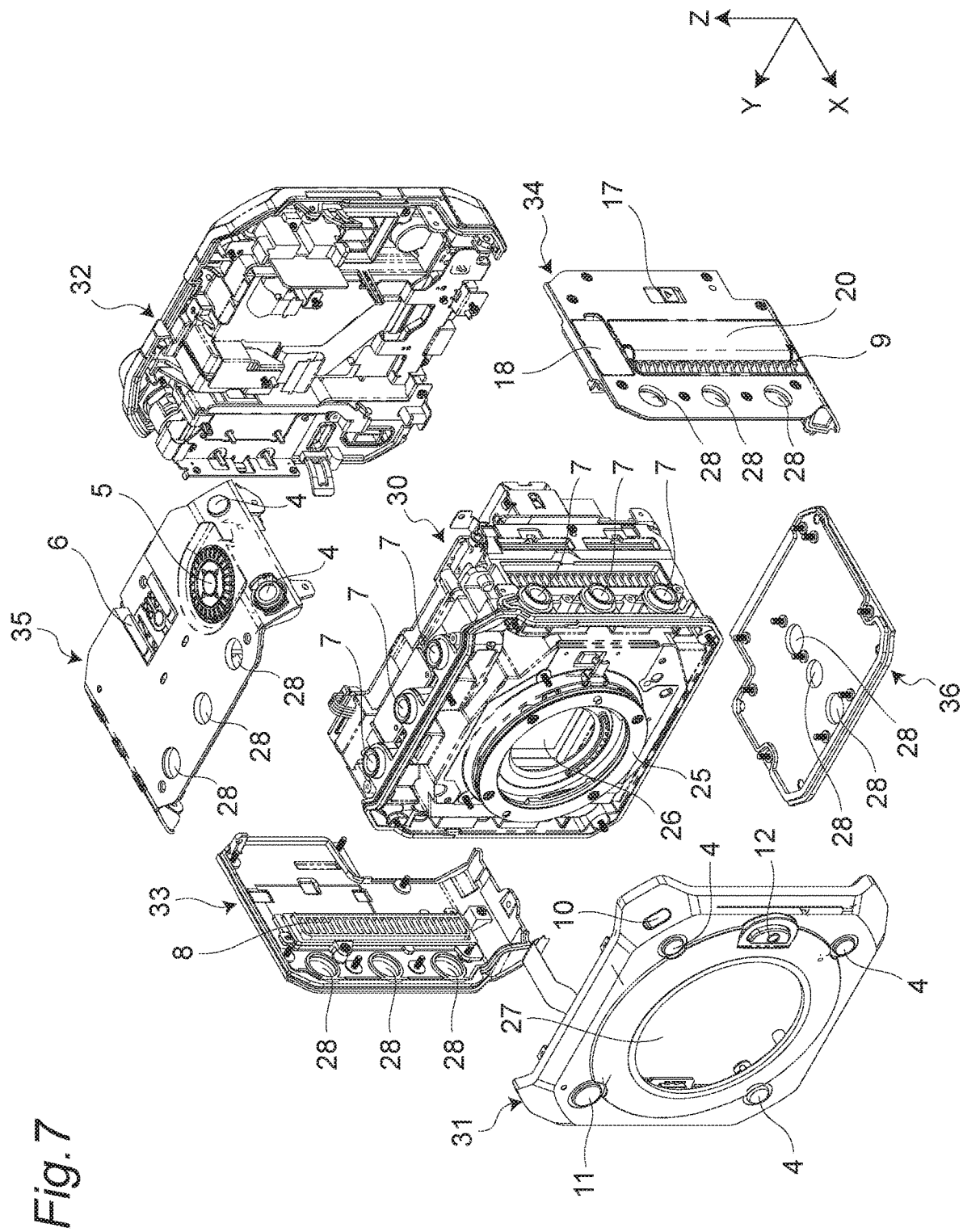
FIG. 7 is an exploded perspective view of the camera main body according to the first embodiment.

FIG. 6 is a perspective view showing the camera main body 2 when the interchangeable lens 3 is removed from the camera 1 of the first embodiment. FIG. 7 is an exploded perspective view of the camera main body 2. The exploded perspective view of FIG. 7 is an exploded view of the camera main body 2 disassembled into seven units. In the camera main body 2 shown in the exploded view of FIG. 7, a housing forming an exterior appearance is made up of a camera main body unit 30, a front surface unit 31, a back surface unit 32, a left side surface unit 33, a right side surface unit 34, a top surface unit 35, and a bottom surface unit 36. Each of the units shown in FIG. 7 does not represent an integrated object, is not a constituent object providing a single function, and has a configuration that can be further disassembled; however, for convenience, each unit will be referred to as a unit.

The front surface unit 31 constitutes the front surface of the housing of the camera main body 2, has a lens opening 27 for mounting the interchangeable lens 3, and is provided with the lens removal button 12, the multiple function buttons 4, the tally light 10, etc.

The left side surface unit 33 has the vertically-long intake port 8, and the intake port 8 has multiple gaps due to multiple partitions extending in the X direction. The left side surface unit 33 has multiple (in the configuration of the first embodiment, three) screw openings 28 arranged in line in the Z direction such that the screw holes 7 disposed in the camera main body unit 30 are arranged therein. The left side surface unit 33 has main members made of a metal material, for example, lightweight metal having a high thermal conductivity such as aluminum alloy and is made up of heat dissipation members. The left side surface unit 33 is disposed in a conduction path of heat generated inside the camera main body 2, is exposed to the outside of the device, and therefore has a function of heat dissipation to the outside of the device.

The bottom surface unit 36 constituting the bottom surface of the camera main body 2 in the first embodiment has the multiple (in the configuration of the first embodiment, three) screw openings 28 arranged in line in the X direction such that the screw holes 7 disposed in the camera main body unit 30 are arranged therein. Similar to the left side surface unit 33, the bottom surface unit 36 has main members made of a metal material, for example, lightweight metal having a high thermal conductivity such as aluminum alloy and is made up of heat dissipation members. The bottom surface unit 36 is disposed in a conduction path inside the camera main body 2, is exposed to the outside of the device, and therefore has a function of heat dissipation to the outside of the device.

The top surface unit 35 constituting the top surface of the camera main body 2 in the first embodiment has the multiple (in the configuration of the first embodiment, three) screw openings 28 arranged in line in the Y direction such that the screw holes 7 disposed in the camera main body unit 30 are arranged therein. The top surface unit 35 in the first embodiment has main members made of a metal material, for example, lightweight metal having a high thermal conductivity such as aluminum alloy and has a function enabling dissipation of heat generated inside the camera main body 2.

The configuration of the first embodiment is described with an example in which the left side surface unit 33, the bottom surface unit 36, and the top surface unit 35 are made of a metal material having a heat dissipation function as described above; however, in the configuration of the first embodiment, at least the left side surface unit 33 and the bottom surface unit 36 are preferably made of a metal material capable of dissipating heat, and the other units (31, 32, 34, 35) may also have main members made of a metal material to achieve a configuration further enhancing the heat dissipation effect, as long as the weight can be reduced and use of an electrically conductive material causes no problem.

As shown in FIG. 7, the right side surface unit 34 constituting the right side surface of the camera main body 2 is provided with the discharge port 9, and the multiple (in the configuration of the first embodiment, three) screw openings 28 are arranged in line in the Z direction. The card door 20 and the card door opening/closing button 17 for opening/closing the card slots 15, 16 disposed on the camera main body unit 30 are disposed in the right side surface unit 34.

As shown in FIG. 5D, the back surface unit 32 constituting the back surface of the camera main body 2 is provided with the power input terminal 14, the various connection terminals 38 for transmitting/receiving various signals to/from an external device, openings communicating with the connection terminals 38 disposed in the camera main body unit 30, etc. The back surface unit 32 has a battery mounting part 21 formed thereon and is provided with an attachment/detachment mechanism for a battery.

Figure 8:
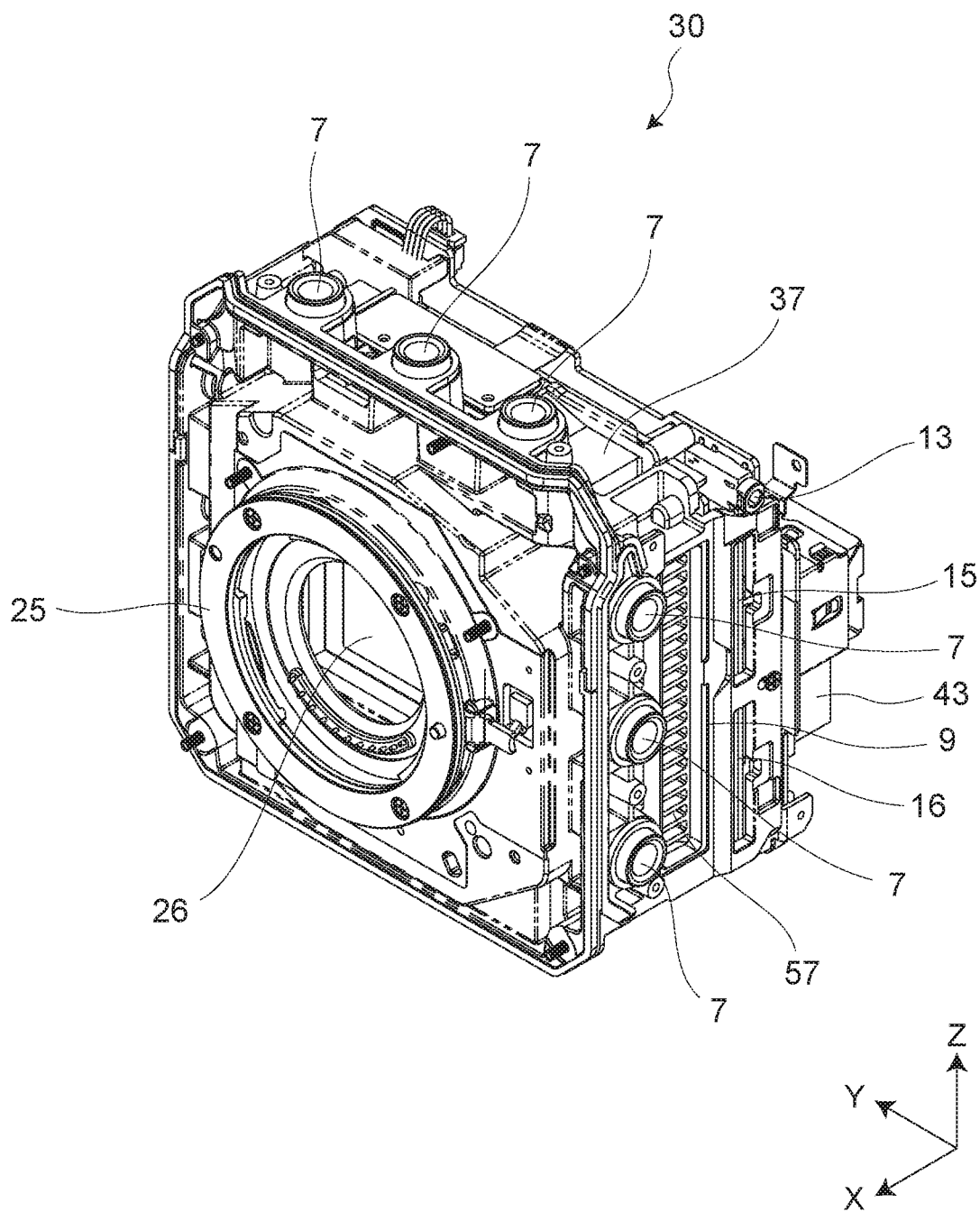
FIG. 8 is a perspective view showing a camera main body unit according to the first embodiment.

FIG. 8 is a perspective view showing the camera main body unit 30. In the camera main body unit 30 shown in FIG. 8, the multiple screw holes 7 disposed on the sides of the top surface, the right side surface, the left side surface, and the bottom surface are formed in one metal block 37 and are disposed in an integrated manner. The metal block 37 is made of a lightweight metal having a high thermal conductivity such as an aluminum alloy, for example. A lens holding part 25 for mounting the interchangeable lens 3 is fixed to the metal block 37. The front surface unit 31, the back surface unit 32, the left side surface unit 33, the right side surface unit 34, the top surface unit 35, and the bottom surface unit 36 constituting the outer surface of the camera main body 2 are fixed to the metal block 37.

The camera main body unit 30 includes an imaging sensor 26 capturing an object image formed through an optical system of the mounted interchangeable lens 3 to form image data. The imaging sensor 26 is made up of a CCD image sensor, a CMOS image sensor, or an NMOS image sensor, for example. The image data formed by the imaging sensor 26 is subjected to a predetermined image process in an image processing circuit. The image data subjected to the predetermined image process is recorded on a memory card by a control circuit etc., and is output based on a command from an external device. A circuit board holding electric circuits such as the image processing circuit, the control circuit, and a power circuit is disposed in the camera main body unit 30. In the camera main body unit 30 according to the first embodiment, multiple circuit boards are disposed side by side at a predetermined interval so as to reduce the size and to achieve a box type configuration.

Since the camera main body unit 30 has a configuration in which multiple heat-generating components are mounted on the circuit boards, efficient cooling is performed by a forced cooling structure using the one small fan 56 (see FIG. 13), i.e., a sirocco fan, as a cooling source for cooling the multiple heat-generating components, and a natural cooling structure using natural cooling. The details of the cooling structure in the camera 1 of the first embodiment will be described later.

FIG. 9 is a perspective view of the camera main body unit 30 further disassembled. The camera main body unit 30 shown in FIG. 9 includes the lens holding part 25 having the imaging sensor 26, a main body frame part 40 having the metal block 37, a main circuit board (first circuit board) 41, and a sub-circuit board (second circuit board) 42. The main circuit board 41 is provided with the first card slot 15 and the second card slot 16 so that two memory cards can be mounted. Since the main circuit board 41 is closer to the imaging sensor 26 as compared to the sub-circuit board 42, an image processing circuit and a signal processing circuit are formed thereon, and multiple heat-generating components 43 (e.g., image processing engine, FPGA) used in the image processing circuit and the signal processing circuit are mounted thereon. Since the sub-circuit board 42 is closer to the input/output terminals of power input and signal input/output, a power source circuit, a control circuit, etc. are formed thereon, and multiple heat-generating components (e.g. POE transformer, PoE FET) 43 used in these circuits are mounted thereon. Although the configuration of the first embodiment is described with an example in which the heat-generating components mounted on the main circuit board 41 and the sub-circuit board 42 are configured as described above, the present disclosure is not limited to such a configuration.

Figure 10B:
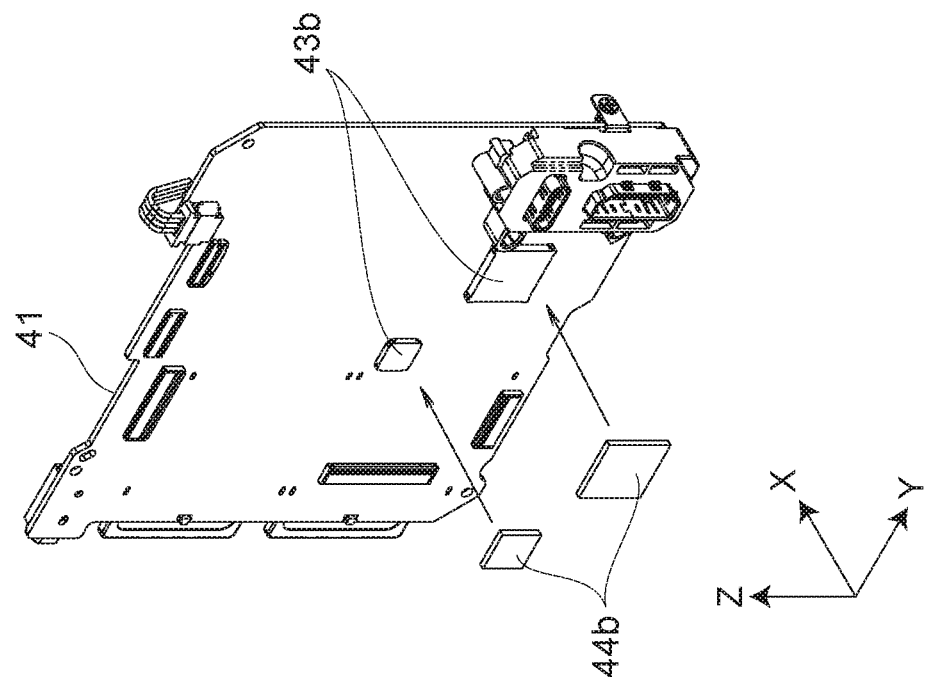
FIG. 10B is a perspective view schematically showing some of constituent elements on a main circuit board according to the first embodiment.
Figure 10A:
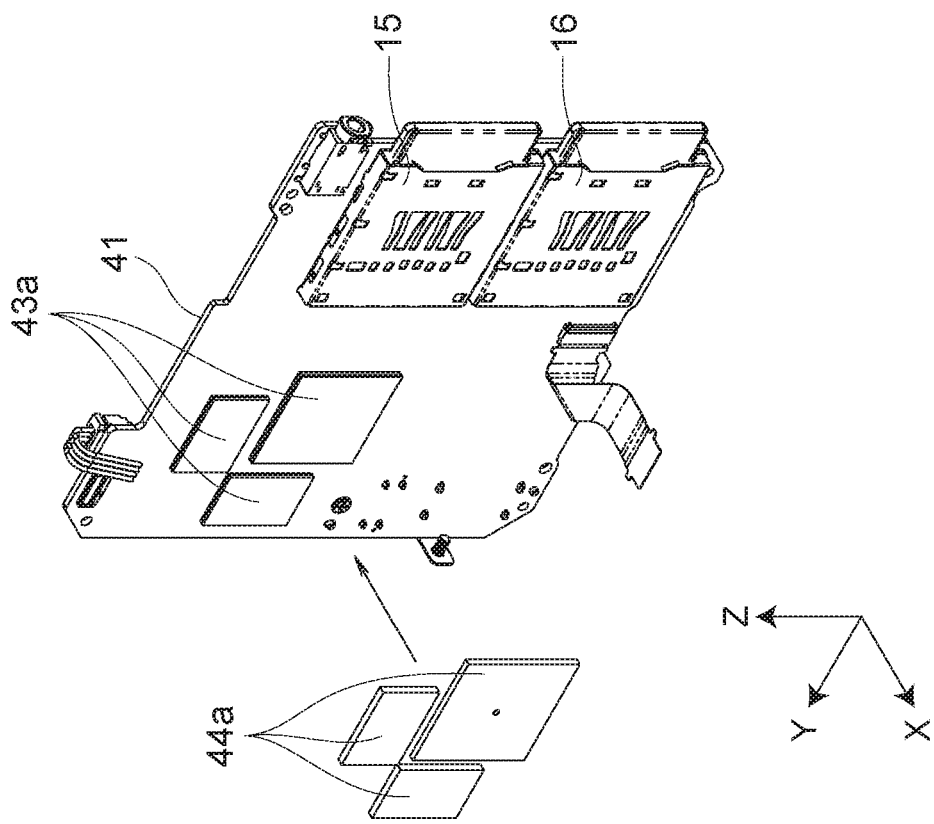
FIG. 10A is a perspective view schematically showing some of constituent elements on a main circuit board according to the first embodiment.

FIGS. 10A and 10B are perspective views schematically showing some of constituent elements of the main circuit board (first circuit board) 41. FIG. 10A is a perspective views mainly showing a state of the main circuit board 41 viewed from the front side (lens side) (the state viewed in the negative X-axis direction), and FIG. 10B is a perspective view mainly showing a state of the main circuit board 41 viewed from the rear side (back side) (the state viewed in the positive X-axis direction.

As shown in FIG. 10A, devices of three image processing engines acting as the heat-generating components 43 (first heat-generating components 43a) are mounted on a circuit on the front side of the main circuit board 41. Cooling sheets 44 (first cooling sheets 44a) are affixed to the first heat-generating components 43a. The cooling sheets 44 have excellent thermal conductivity and electrical insulation and is made of an elastic member to have flexibility. Affixing regions for the first cooling sheets 44a on the first heat-generating components 43a are top regions of the first heat-generating components 43a, and in the configuration of the first embodiment, the sheets are affixed to the entire surfaces of the regions facing the lens side. These first cooling sheets 44a are arranged to come into close contact with a first heat dissipation plate (see FIG. 13) 45 provided with a heat sink 57 having multiple heat dissipation fins forcibly cooled by the fan 56 described later.

As described above, the first cooling sheets 44a affixed to the top regions of the first heat-generating components 43a have flexibility, and therefore, even if each of the multiple first heat-generating components 43a has a difference in position of a top portion (height from the circuit board), the difference can be absorbed. The thickness and elasticity of the first cooling sheet 44a to be affixed are determined in consideration of the shape (height from the circuit board etc.) of the first heat-generating component 43a to which the sheet is affixed.

As shown in FIG. 10B, the multiple heat-generating components 43 (second heat-generating components 43b) are mounted also on a circuit on the rear side (back side) of the main circuit board 41. The cooling sheets 44 (second cooling sheets 44b) are also affixed to these second heat-generating components 43b in the entire region of the top portion thereof. These second cooling sheets 44b are arranged to come into close contact with a second heat dissipation plate 46 (see FIG. 11) connected in a heat conductive manner to the bottom surface unit 36 as described later.

FIGS. 11A to 11B are perspective views schematically showing some of constituent elements on the sub-circuit board (second circuit board) 42. FIG. 11A is a perspective view mainly showing a state of the sub-circuit board 42 viewed from the front side (lens side) (the state viewed in the negative X-axis direction), and FIG. 11B is a perspective view mainly showing a state of the sub-circuit board 42 viewed from the rear side (back side) (the state viewed in the positive X-axis direction).

As shown in FIG. 11A, the second heat dissipation plate 46 is disposed on the front side of the sub-circuit board 42. As described above, the second heat dissipation plate 46 is arranged to come into close contact with the second cooling sheets 44b affixed to the second heat-generating components 43b mounted on the circuit on the back side of the main circuit board 41. The second heat dissipation plate 46 is connected in a heat conductive manner via a second heat conductive sheet 48b to the bottom surface unit 36. Therefore, the heat from the second heat-generating components 43b is transferred via the second cooling sheets 44b, the second heat dissipation plate 46, and the second heat conductive sheet 48b to the bottom surface unit 36 for heat dissipation.

The second heat dissipation plate 46 includes two contact parts 46a, 46b having surfaces coming into contact with the second cooling sheets 44b in the top regions of the second heat-generating components 43b, and a heat transfer part 46c connected in a heat conductive manner via the second heat conductive sheet 48b to the bottom surface unit 36. As shown in FIG. 10B, in the configuration of the first embodiment, the two second heat-generating components 43b are mounted on the circuit on the rear side (back side) of the main circuit board 41 at a slight distance from each other, and the second cooling sheet 44b is affixed to and in contact with each of the second heat-generating components 43b. Therefore, the second heat dissipation plate 46 has the two contact parts (the first contact part 46a and the second contact part 46b) and has a configuration capable of conducting the heat from the second heat-generating components 43b, from the heat transfer part 46c via the second heat conductive sheet 48b to the bottom surface unit 36.

The second heat conductive sheet 48b disposed between the heat transfer part 46c of the second heat dissipation plate 46 and the bottom surface unit 36 has a configuration with a thickness capable of absorbing an arrangement error of the second heat dissipation plate 46. The second heat conductive sheet 48b may have the same configuration as the cooling sheet 44 and has excellent heat conduction ability and high electrical insulation ability, ensuring high reliability of the apparatus.

The configuration of the first embodiment is described with an example in which the second heat dissipation plate 46 is thermally conductively connected via the second heat conductive sheet 48b to the bottom surface unit 36; however, the second heat dissipation plate 46 may directly be connected to the bottom surface unit 36 as long as no problem occurs in processing accuracy and electrical insulation.

As shown in FIG. 11B, third heat-generating components 43c (e.g. PoE transformer, PoE FET) acting as large heat sources are mounted on the circuit on the back side of the sub-circuit board (second circuit board) 42. It is difficult to achieve a configuration in which a heat dissipation member is brought into contact with top portions (back-side top portions) of these third heat-generating components 43c to dissipate heat, and even if such a configuration is achieved, the heat dissipation efficiency is poor since a heat-generating portion exists on the substrate side. Therefore, in the configuration of the first embodiment, third cooling sheets 44c are affixed to a corresponding position on the front side of the sub-circuit board 42, and a third heat dissipation plate 47 is brought into close contact with the third cooling sheets 44c. The third heat dissipation plate 47 is connected in a heat conductive manner via a third heat conductive sheet 48c to the bottom surface unit 36. As a result, the heat of the third heat-generating component 43c mounted on the sub-circuit board 42 is transferred via the sub-circuit board 42, the third cooling sheets 44c, the third heat dissipation plate 47, and the third heat conductive sheet 48c to the bottom surface unit 36 for heat dissipation. The third heat conductive sheet 48c may have the same configuration as the cooling sheet 44 and has heat conduction ability and electrical insulation ability.

The configuration of the first embodiment is described with an example in which the third heat dissipation plate 47 is thermally conductively connected via the third heat conductive sheet 48c to the bottom surface unit 36; however, the third heat dissipation plate 47 may directly be connected to the bottom surface unit 36 as long as no problem occurs in processing accuracy and electrical insulation.

The configuration of the first embodiment has been described with the example in which the third heat-generating component 43c is mounted on the circuit on the back side of the sub-circuit board (second circuit board) 42; however, even in the configuration in which the third heat-generating component 43c is mounted on the front side of the sub-circuit board (second circuit board) 42, the heat from the third heat-generating component 43c may be transferred from the third heat dissipation plate 47 to the bottom surface unit 36 via the third cooling sheets 44c brought into contact with the third heat-generating component 43c.

Figure 12:
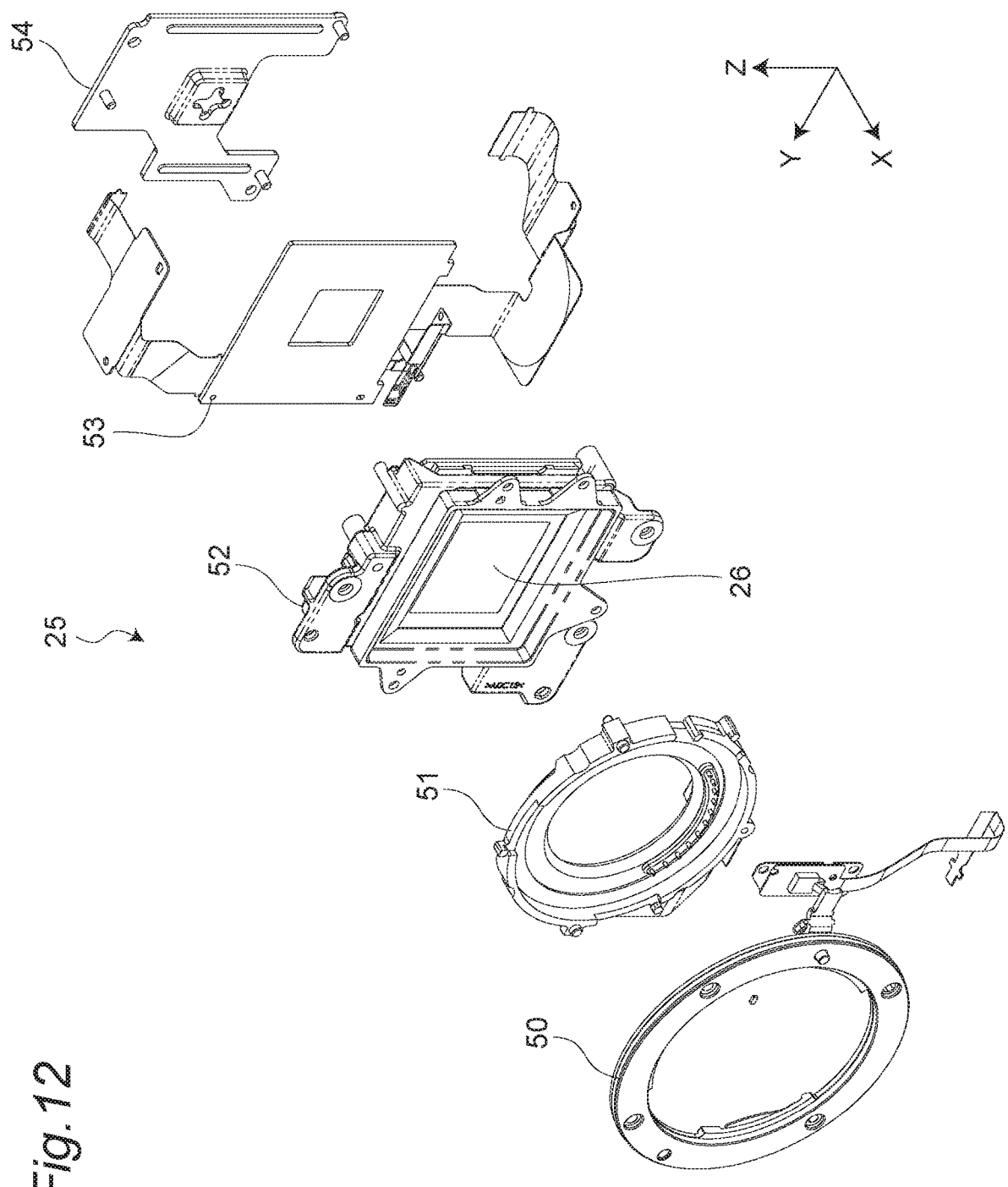
FIG. 12 is an exploded perspective view showing a lens holding part according to the first embodiment.

FIG. 12 is an exploded perspective view showing the lens holding part 25 having the imaging sensor 26 and to which the interchangeable lens 3 is mounted. The lens holding part 25 includes a lens mount unit 50 to which the interchangeable lens 3 is fixed, a lens connector unit 51 serving as an electrical connection terminal to the interchangeable lens 3, a lens sensor unit 52 holding the imaging sensor 26, a lens sensor circuit board 53 having a circuit processing an image signal from the imaging sensor 26, and a sensor heat dissipation plate 54 for cooling heat-generating components mounted on the lens sensor circuit board 53.

Figure 13:
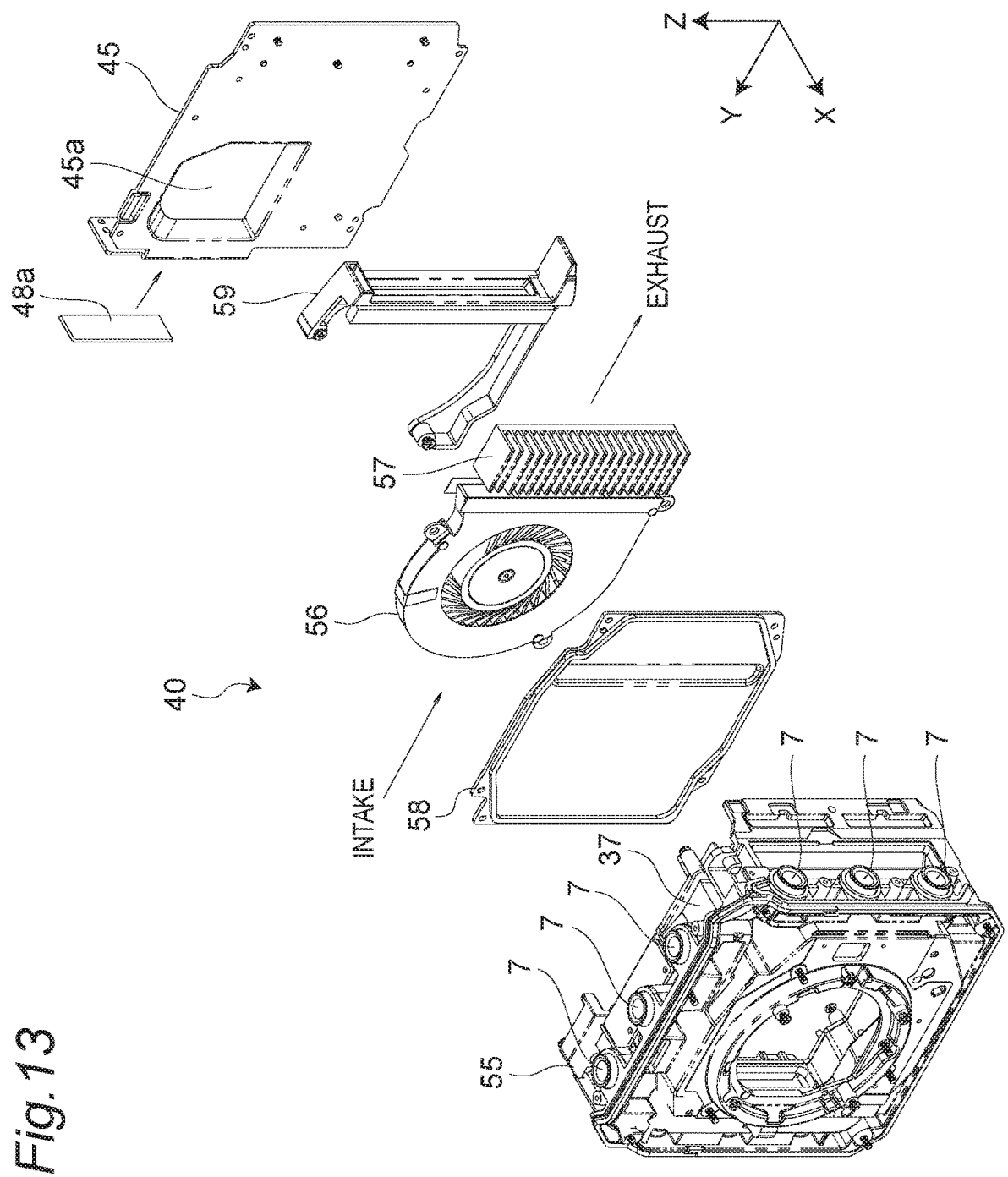
FIG. 13 is a view of the main body frame part shown in FIG. 9 further disassembled.

FIG. 13 is a view in which the main body frame part 40 in the camera main body unit 30 shown in FIG. 9 is further disassembled. The main body frame part 40 includes: a frame unit 55 mainly composed of a metal block 37 made of lightweight metal having excellent thermal conductivity, for example, aluminum alloy; the fan 56 serving as a cooling source; the heat sink (heat dissipation fins) 57 disposed in a discharge region of the fan 56; a fan duct cover 58 disposed as a partition plate between the lens holding part 25 having the imaging sensor 26 etc. and the fan 56 and air-cooled by the fan 56; a fan holder 59 holding the fan 56 at a predetermined position; and the first heat dissipation plate 45 disposed adjacent to the fan 56 for heat conduction and heat dissipation of the heat from the heat-generating components (43a etc.) of the main circuit board (first circuit board) 41. The heat sink 57 is fixed (screw-fastened and fixed) to the first heat dissipation plate 45. A fan duct cover 58 is disposed between the lens holding part 25 (see FIG. 12) and the fan 56 such that air moved by the fan 56 does not flow into the arrangement region of the imaging sensor 26 etc. of the lens holding part 25.

The first heat dissipation plate 45 is provided with a convex part 45a protruding toward the main circuit board (the back surface). The convex part 45a is formed to press the entire surface of the first cooling sheets 44a affixed to the top portions of the first heat-generating components 43a of the main circuit board 41 and to come into close contact with each other. In the configuration of the first embodiment, the first heat dissipation plate 45 is connected in a heat conductive manner via the first heat conductive sheet 48a to the left side surface unit 33. Therefore, the heat from the heat-generating components (43a etc.) mounted on the main circuit board 41 is dissipated by the left side surface unit 33 made of a heat dissipation material (e.g., aluminum alloy) via the cooling sheets (44a, 44b) and the first heat dissipation plate 45. Since the heat sink 57 fixed to the first heat dissipation plate 45 is disposed adjacent to the fan holder 59, the heat sink 57 and the first heat dissipation plate 45 are air-cooled by the fan 56. The first heat conductive sheet 48a may have the same configuration as the cooling sheet 44 and has heat conduction ability and electrical insulation ability.

The configuration of the first embodiment is described with an example in which the first heat dissipation plate 45 is thermally conductively connected via the first heat conductive sheet 48a to the left side surface unit 33; however, the first heat dissipation plate 45 may directly be connected to the left side surface unit 33 as long as no problem occurs in processing accuracy and electrical insulation.

[Cooling Structure]

Figure 14:
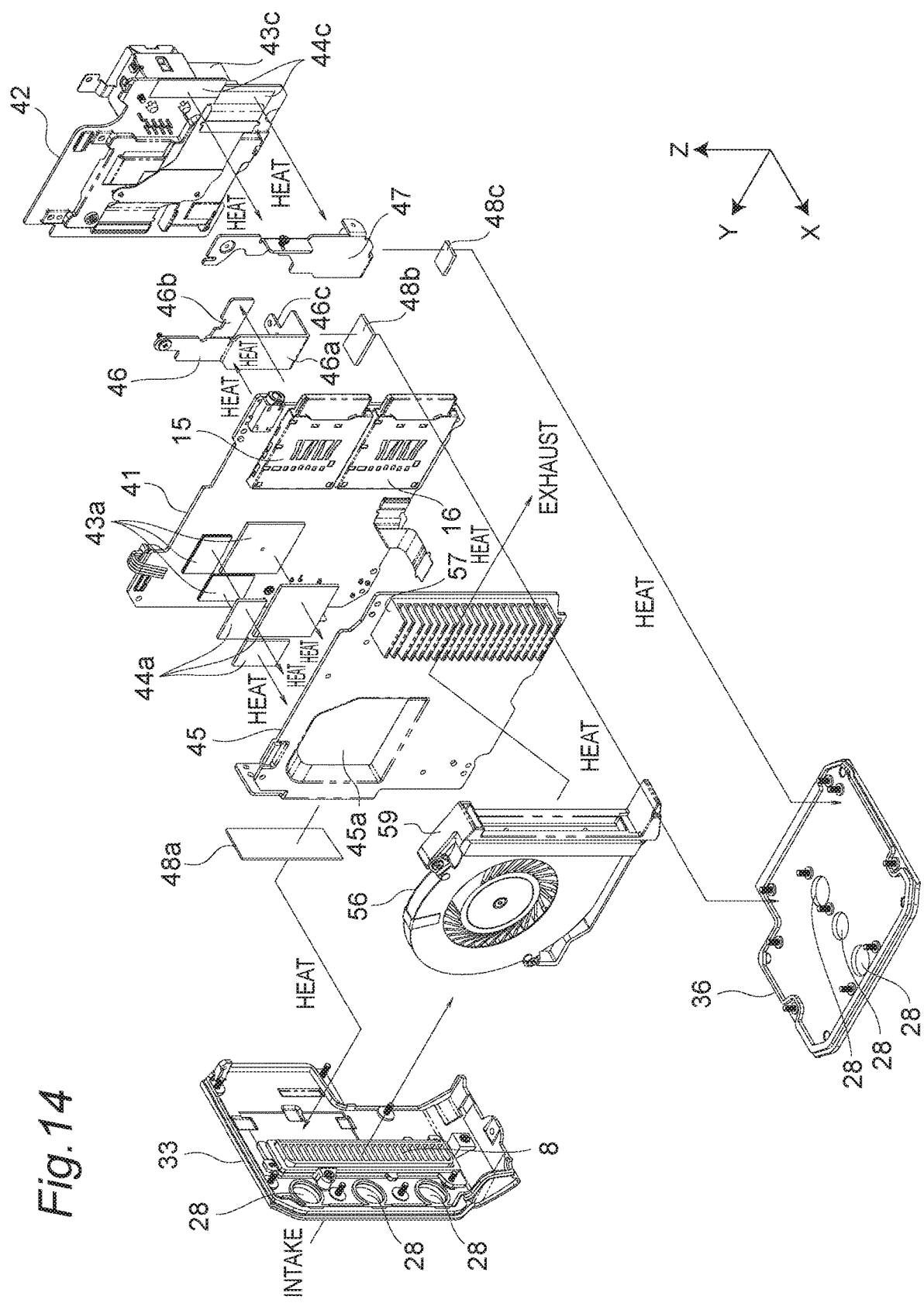
FIG. 14 is an exploded perspective view of a cooling structure of the camera of the first embodiment as viewed diagonally from above on the front side.
Figure 15:
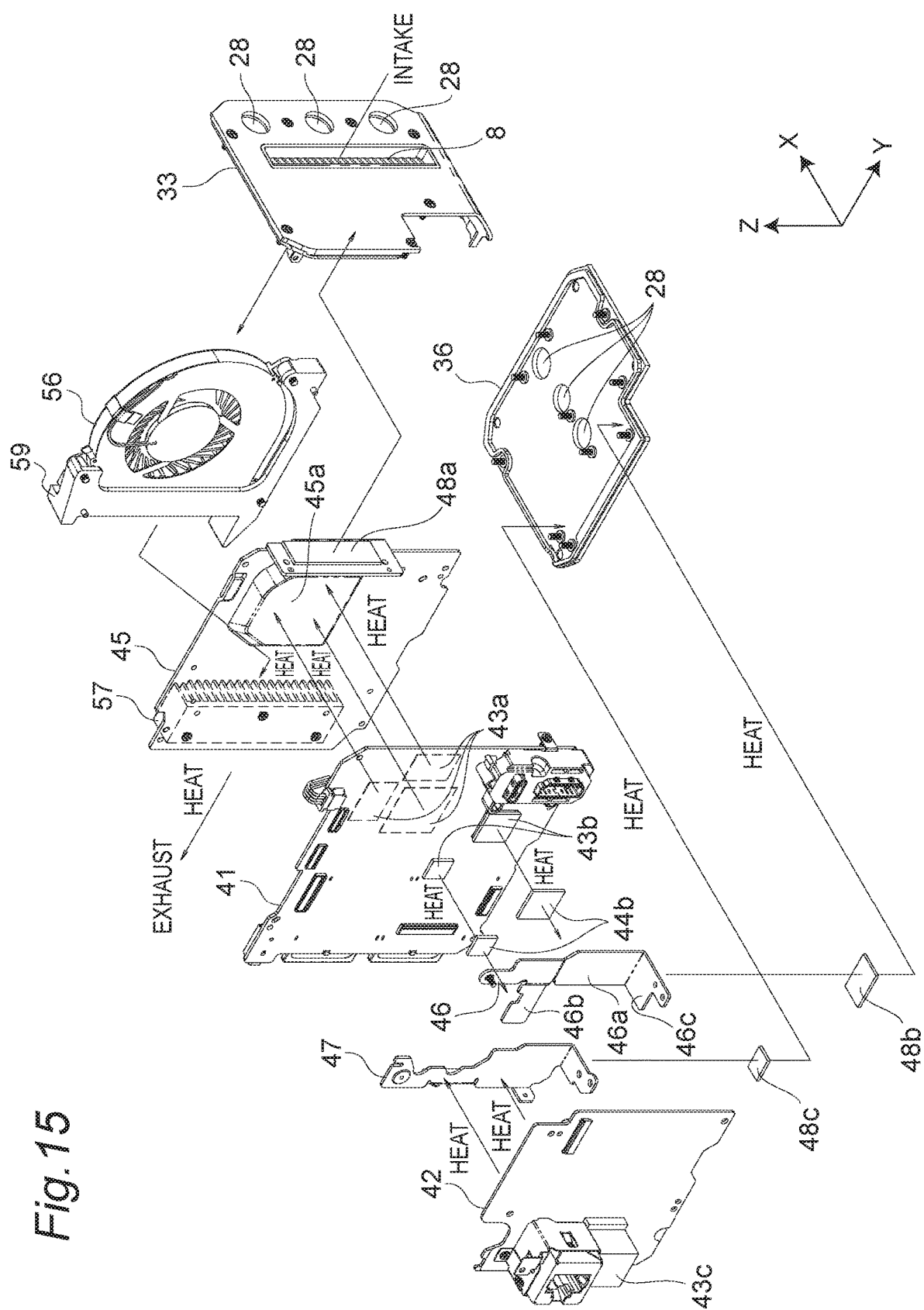
FIG. 15 is an exploded perspective view of the cooling structure of the camera of the first embodiment as viewed diagonally from above on the back side.

FIGS. 14 and 15 are exploded perspective views showing a cooling structure in the box-type camera 1 of the first embodiment. FIG. 14 is a view of the cooling structure inside the camera 1 as viewed diagonally from above on the front side (lens side). FIG. 15 is a view of the cooling structure inside the camera 1 as viewed diagonally from above on the back side.

As shown in FIGS. 14 and 15, the first heat dissipation plate 45 is disposed adjacent to the fan holder 59 holding the fan 56 serving as a forced cooling source. The heat sink (heat dissipation fins) 57 directly air-cooled by the fan 56 is fixed to the fan holder 59. Therefore, the first heat dissipation plate 45 is air-cooled by the fan 56 together with the heat sink 57.

The fan 56 is a sirocco fan having a rotation axis arranged to extend in the X direction and is configured to take in air from two suction portion on both sides in the rotation axis (X axis) direction and discharge air in the outer circumferential direction. When the fan 56 in the first embodiment is driven, air is taken in from the side surfaces of the both sides of the fan 56 and discharged linearly in one direction, toward the right side surface in FIG. 14, through a duct disposed on the outer circumference of the fan 56. Therefore, when the fan 56 is driven, air is taken in from the intake port 8 of the left side surface unit 33 constituting the left side surface of the camera 1 and is discharged toward the discharge port 9 (see FIG. 5C) of the right side surface unit 34 in the outer circumferential direction of the fan 56. As described above, when the fan 56 is driven, the air from the intake port 8 flows to the suction portions on both sides of the fan 56, so that the air flows to the first heat dissipation plate 45 and the fan duct cover 58 adjacent to both sides of the fan 56. As a result, the first heat dissipation plate 45 and fan duct cover 58 air-cooled directly. And further, since the air from the fan 56 passes through the heat sink (heat dissipation fins) 57 and is discharged from the discharge port 9, the heat sink 57 and the first heat dissipation plate 45 are further air-cooled. As described above, the camera 1 of the first embodiment has the forced cooling structure in which the fan 56 is used as a cooling source to directly air-cool the first heat dissipation plate 45, the fan duct cover 58, and the heat sink 57.

In addition to the forced cooling structure described above, the camera 1 of the first embodiment includes the natural cooling structure in which the heat from a heat-generating source (heat-generating member) is efficiently thermally conducted to the outer surface of the housing of the camera 1 and dissipated from the outer surface of the camera 1 for cooling. As shown in FIGS. 14 and 15, the heat from the multiple first heat-generating components 43a mounted on the surface facing the first heat dissipation plate 45 disposed on the front side in the main circuit board (first circuit board) 41 is transferred to the convex part 45a of the first heat dissipation plate 45 via the first cooling sheets 44a affixed to the top portions of the first heat-generating components 43a. The heat transferred to the first heat dissipation plate 45 is dissipated by the heat sink 57 (heat dissipation fins) fixed to the first heat dissipation plate 45 and is transferred from the first heat dissipation plate 45 via the first heat conductive sheet 48a to the left side surface unit 33. Since the left side surface unit 33 constituting the left side surface of the housing of the camera 1 is mainly composed of a metal material having excellent heat conduction, the heat transferred to the left side surface unit 33 is dissipated from the left side surface to the outside for natural cooling.

The heat from the multiple second heat-generating components 43b mounted on the surface facing the sub-circuit board (second circuit board) 42 disposed on the back side in the main circuit board (first circuit board) 41 is transferred to the first contact part 46a and the second contact part 46b of the second heat dissipation plate 46 via the second cooling sheets 44b affixed to the top portions of the second heat-generating components 43b. The heat transferred to the second heat dissipation plate 46 is transferred to the bottom surface unit 36 via the second heat conductive sheet 48b. Since the bottom surface unit 36 is made of a metal material having excellent heat conduction and constitutes the outer surface of the housing of the camera 1, the heat transferred to the bottom surface unit 36 is reliably dissipated to the outside for natural cooling.

The third heat-generating component 43c acting as a large heat-generating source in the sub-circuit board (second circuit board) 42 is mounted on the back side. As described above, the third heat-generating component 43c is cooled by affixing the multiple third cooling sheets 44c to the corresponding positions on the front side of the sub-circuit board 42 and bringing the third heat dissipation plate 47 into close contact with the third cooling sheets 44c. The third heat dissipation plate 47 is thermally conductively connected via the third heat conductive sheet 48c to the bottom surface unit 36. As a result, the heat of the third heat-generating component 43c mounted on the sub-circuit board 42 is transferred via the sub-circuit board 42, the third cooling sheets 44c, the third heat dissipation plate 47, and the third heat conductive sheet 48c to the bottom surface unit 36 for heat dissipation.

As described above, the cooling structure in the camera 1 of the first embodiment includes the forced cooling structure in which the fan 56 is used as a cooling source to directly cool the heat sink 57 (heat dissipation fins) and the first heat dissipation plate 45 and also includes the natural cooling structure made up of the multiple heat dissipation plates (45, 46, 47), the cooling sheets 44 (44a, 44b, 44c) having electrical insulation ability and heat conduction ability, the heat conductive sheet 48 (48a, 48b, 48c) having at least heat conduction ability), and lightweight members constituting the outer surface of the camera 1 and having excellent heat conduction ability, for example, outer surface units made up of metal members (at least portions of the housing such as the left side surface unit 33 and the bottom surface unit 36), so that the cooling structure has excellent cooling ability. In the natural cooling structure in the first embodiment, heat conduction paths are formed in the scattered regions of the respective heat-generating components (43a, 43b, 43c) mounted on the multiple circuit boards arranged side by side, and the heat from the respective heat-generating components is transferred via the heat conduction paths to the outer surface units constituting the outer surface of the housing of the camera 1 so that the heat is reliably dissipated.

The configuration of the camera 1 of the first embodiment has been described with the example of the cooling structure in which the multiple heat dissipation plates, the multiple cooling sheets, and the multiple heat conductive sheets are disposed for the multiple heat-generating components as described above; however, in the present disclosure, these cooling members are selectively and appropriately applied depending on the specifications, arrangement, shapes, etc. of the heat-generating components mounted on the circuit boards in the camera.

The camera 1 of the first embodiment has the excellent cooling structure as described above and has an easily-handled configuration. For example, in the configuration of the camera 1 of the first embodiment, since the fixing means (the screw holes 7) are disposed on the top surface, the bottom surface, the left side surface, and the right side surface, the mounting position of the camera 1 on a fixed frame can easily be changed to a desired position. In the camera 1 of the first embodiment, the tally light 10 displaying the operating status of the camera 1 is disposed at the corner portion that is a boundary of three principal surfaces and is arranged at a position visible in at least three directions. By changing the mounting position of the camera 1, the display state of the tally light 10 can be confirmed not only from the front side of the camera 1 but also in any directions from the upper, lower, left, and right sides, so that the camera has an easy-to-handle configuration.

In the configuration of the camera 1 of the first embodiment, the power input terminal 14 and the connection terminal 38 are disposed at the left and right corners on the back side of the camera 1 with the terminal covers disposed for ensuring a connection space for cable connection, and therefore, even when the multiple cameras 1 are used in an adjacently arranged configuration, various cables can easily be connected to the cameras 1 without being affected by the arrangement of the adjacent cameras 1.

Although the box-type single-lens camera has been described as an example in the first embodiment, the cooling structure can be applied to other imaging devices and electronic devices, and in such imaging devices and electronic devices, each heat-generating component can efficiently be cooled even in a configuration in which multiple heat-generating components are mounted on multiple circuit boards in a distributed manner, so that reductions in size and weight, a higher functionality, and ease of handling can be achieved.

Second Embodiment

Figure 16A:
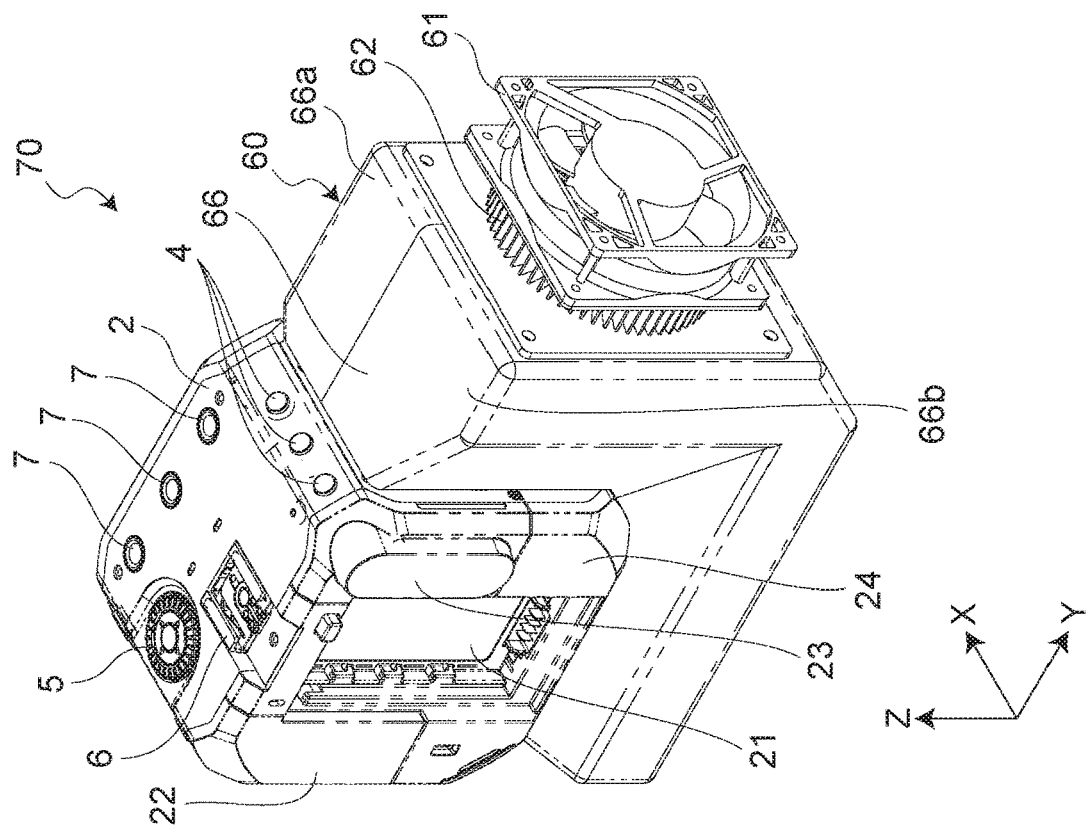
FIG. 16A is a perspective view showing a camera having an external cooling unit of a second embodiment according to the present disclosure.
Figure 16B:
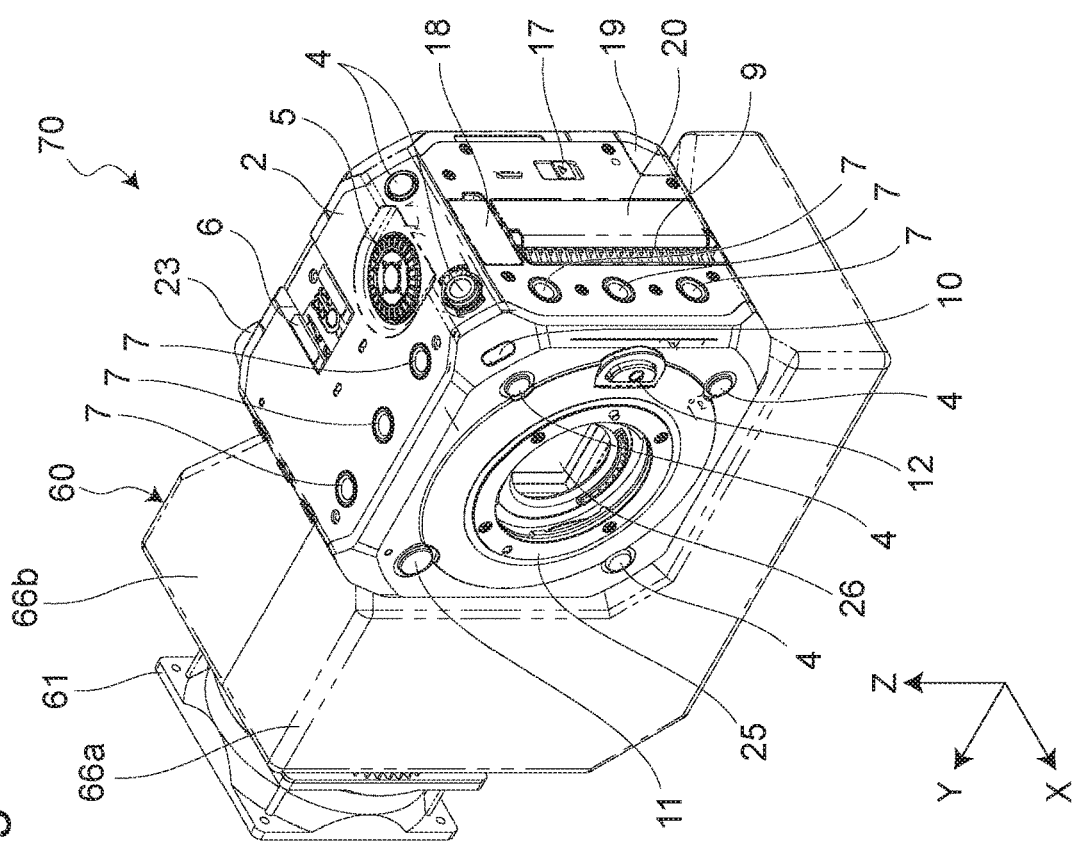
FIG. 16B is a perspective view showing the camera having the external cooling unit of the second embodiment according to the present disclosure.

Description will be made of a camera that is an imaging device of a second embodiment according to the present disclosure. The camera of the second embodiment is a camera having an external cooling unit usable even in a situation where temperature of usage environment is high. FIGS. 16A and 16B are perspective views showing a camera 70 having an external cooling unit 60 of the second embodiment according to the present disclosure. FIG. 16A is a perspective view of the camera 70 as viewed diagonally from above on the right front side. FIG. 16B is a perspective view of the camera 70 as viewed diagonally from above on the left rear side. The camera 70 of the second embodiment has a configuration in which the external cooling unit 60 is disposed on the camera main body 2 of the first embodiment described above. Although FIGS. 16A and 16B show the camera main body 2 provided with the external cooling unit 60 as the camera 70, the interchangeable lens 3 is detachably attached to the camera main body 2 (see FIGS. 1 to 5).

In FIGS. 16A and 16B, the same numbers are assigned to the elements having substantially the same functions and configurations as those in the first embodiment. Since the configuration and operation of the camera main body 2 in the second embodiment are the same as the first embodiment, differences from the first embodiment will mainly be described in the second embodiment. In the second embodiment, a configuration different from the first embodiment is the configuration of the external cooling unit 60 on which the camera main body 2 is mounted.

Figure 17B:
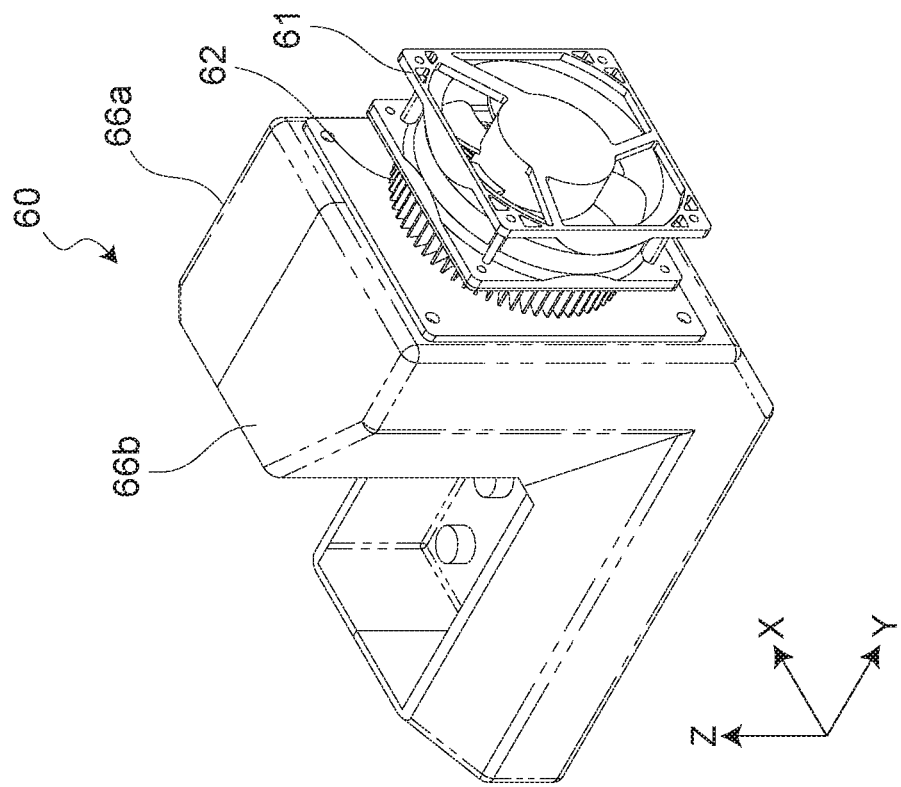
FIG. 17B is a perspective view showing the external cooling unit according to the second embodiment.
Figure 17A:
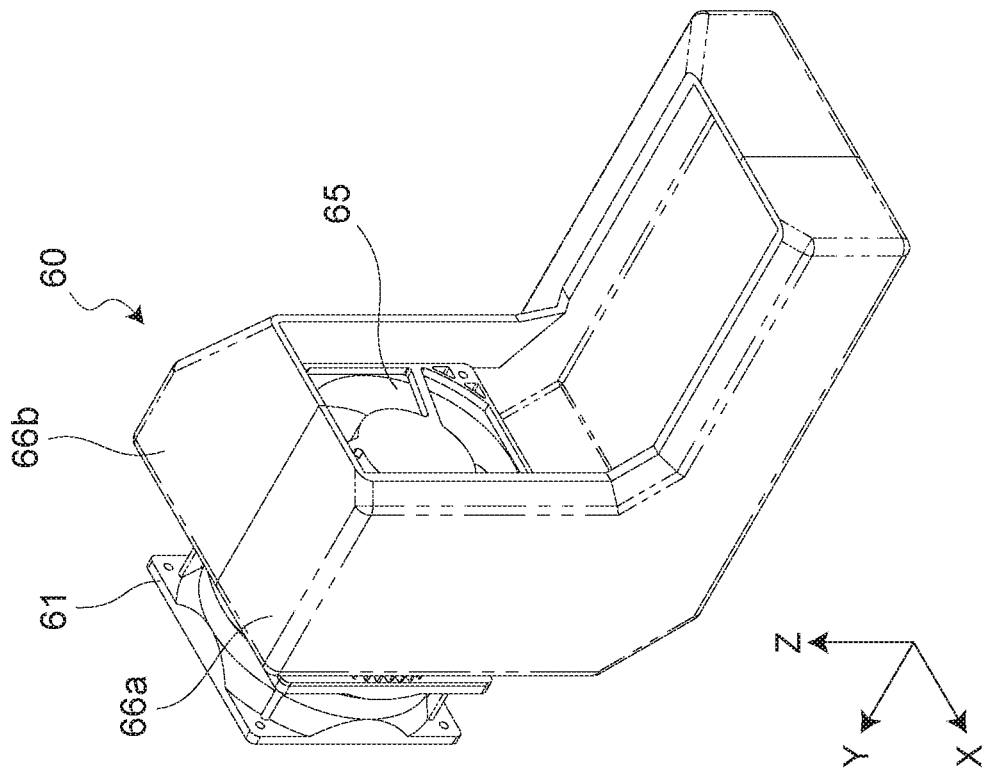
FIG. 17A is a perspective view showing the external cooling unit according to the second embodiment.

FIGS. 17A and 17B are perspective views showing the external cooling unit 60. FIG. 17A is a perspective view of the external cooling unit 60 as viewed diagonally from above on the right side, and FIG. 17B is a perspective view of the external cooling unit 60 as viewed diagonally from above on the left rear side. As shown in FIGS. 16A to 17B, a duct case 66 bent in an L-shape in the external cooling unit 60 is configured to cover the left side surface unit 33 in which the intake port 8 of the camera main body 2 is formed and the bottom surface unit 36.

Figure 18:
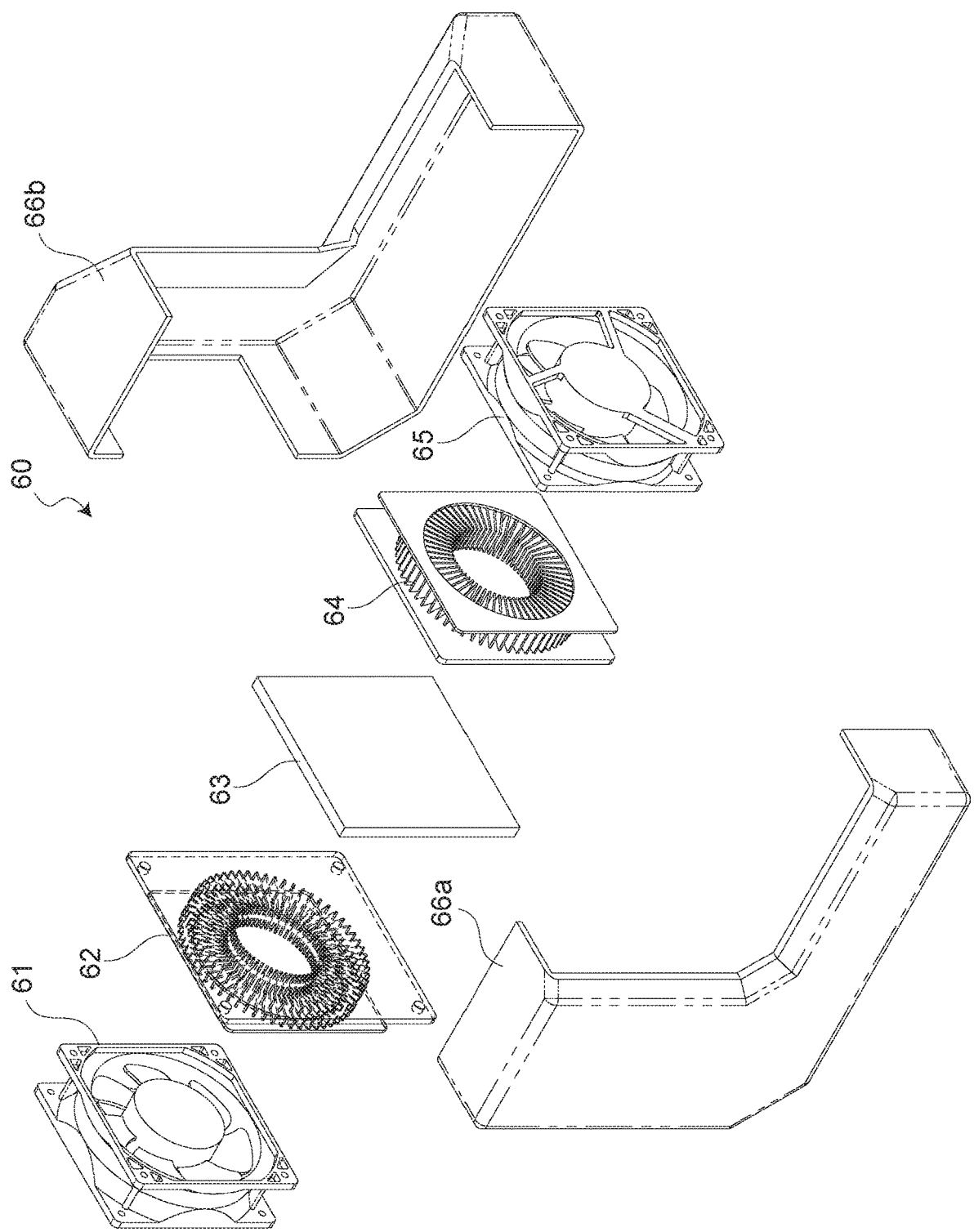
FIG. 18 is an exploded perspective view of the external cooling unit according to the second embodiment.

FIG. 18 is an exploded perspective view of the external cooling unit 60. As shown in FIG. 18, the duct case 66 is provided with a Peltier element 63, and the Peltier element 63 is disposed in a boundary portion between an internal space and an external space of the duct case 66. The Peltier element 63 is a thermoelectric element having one surface serving as a heat-absorbing surface and the other surface serving as a heat-generating surface when a direct current is applied. In the first embodiment, the Peltier element 63 is disposed such that the endothermic surface faces the internal space of the duct case 66 while the exotherm surface faces the external space of the duct case 66.

As shown in FIG. 18, a heat-generating-side heat sink 62 is disposed on the external space side of the Peltier element 63. A heat-generating-side fan 61 is disposed to supply air in the external space to the heat-generating-side heat sink 62. On the other hand, a heat-absorbing-side heat sink 64 is disposed on the internal space side of the Peltier element 63. A heat-absorbing-side fan 65 is disposed to circulate and supply air in the internal space to the heat-absorbing-side heat sink 64. In this way, in the configuration of the second embodiment, the heat-generating-side heat sink 62 and the heat-generating-side fan 61 are disposed on the external space side, and the heat-absorbing-side heat sink 64 and the heat-absorbing-side fan 65 are disposed on the internal space side across the Peltier element 63 to form an external cooling structure. This external cooling structure is disposed in the duct case 66, and the duct case 66 has a configuration that can be divided into at least two parts, i.e., a front-side duct case (first duct case) 66a and a back-side duct case (second duct case) 66b, so as to facilitate assembly of the external cooling structure.

Figures 19A, 19B:
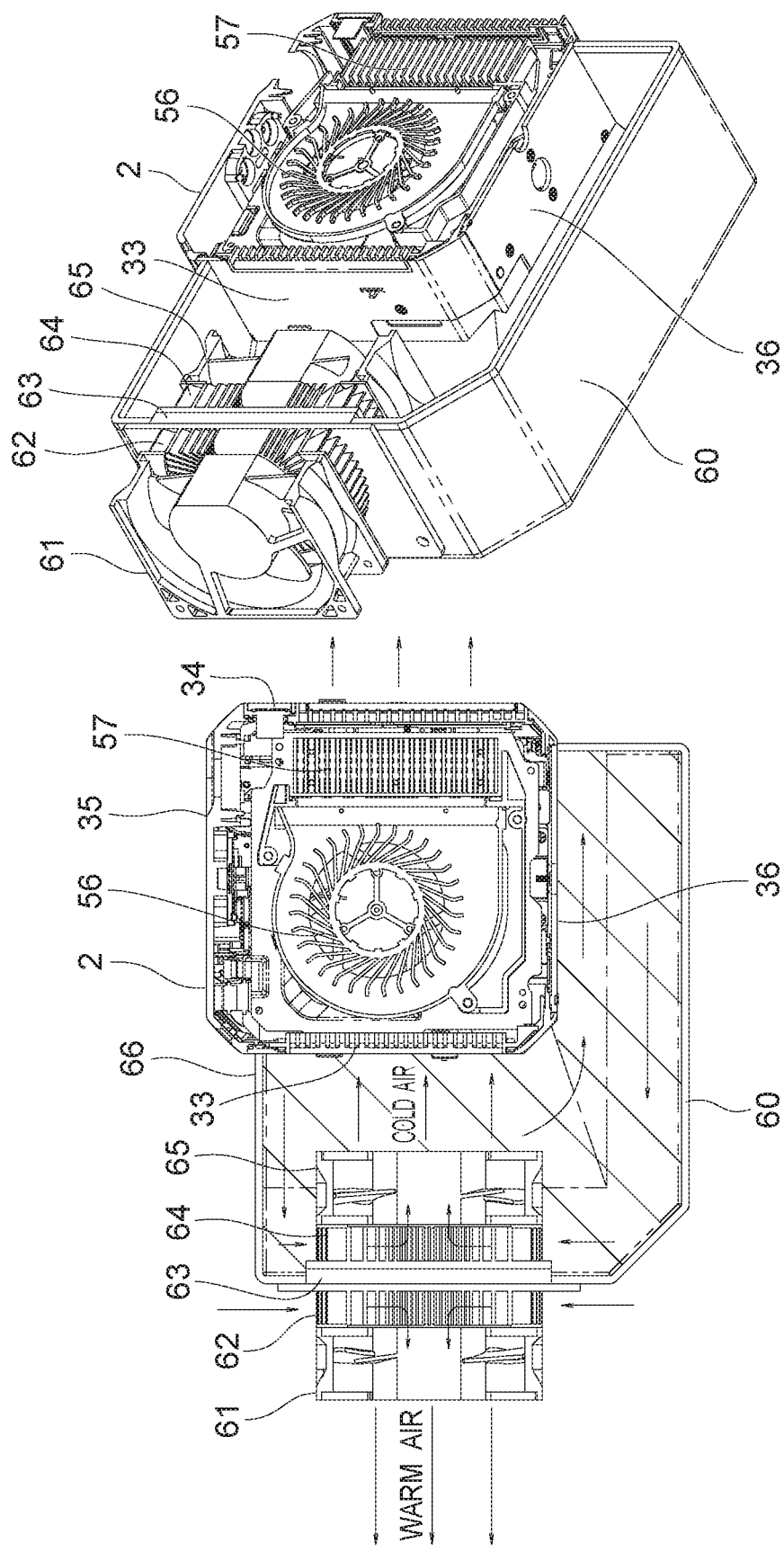
FIG. 19A is a view for explaining the cooling structure for the camera main body with the external cooling unit according to the second embodiment.
FIG. 19B is a view for explaining the cooling structure for the camera main body with the external cooling unit according to the second embodiment.

FIGS. 19A and 19B are views for explaining the cooling structure for the camera main body 2 with the external cooling unit 60 according to the second embodiment. FIG. 19A is a side cross-sectional view of the camera 70 including the external cooling unit 60 and schematically shows main portions in the cooling structure. FIG. 19B is a perspective view of the camera 70 of the side cross-sectional view shown in FIG. 19A as viewed diagonally from below on the left front side.

As indicated by arrows in FIG. 19A, in a region facing the heat-absorbing surface on one side of the Peltier element 63 that is a thermoelectric element, i.e., in a region inside the duct case 66, cold air circulates, and after coming into contact with the left side surface and the bottom surface of the camera main body 2, the cold air returns through the heat-absorbing-side heat sink 64 to the heat-absorbing-side fan 65 to circulate. In contrast, in a region facing the heat-generating surface on the other side of the Peltier element 63, i.e., in a region outside the duct case 66, the heating-side heat sink 62 is air-cooled by the heat-generating-side fan 61, and warm air from the heat-generating-side heat sink 62 is discharged from the heat-generating-side fan 61 to the outside of the apparatus.

As described above, the camera 70 including the external cooling unit 60 according to the second embodiment is configured such that cold air is formed by the heat-absorbing surface of the Peltier element 63 and the heat-absorbing-side fan 65, and that the cold air comes into contact with the outer surface of the camera main body 2, or particularly, the left side surface unit 33 and the bottom surface unit 36 forming heat dissipation surfaces to cool each of the units. As a result, the camera 70 including the external cooling unit 60 according to the second embodiment is configured to be reliably air-cooled even in, for example, an area or place where the temperature of usage environment is high, since cold air is reliably supplied to the intake port 8 of the camera main body 2 and the heat from heat-generating portions of the constituent components of the camera 70 is transferred via the heat conduction paths to the outer surface portions of the camera. The external cooling unit 60 according to the second embodiment is configured in consideration of operability for the camera 70 and ease of insertion and removal of memory cards and in consideration of making the cooling unit 60 externally attachable without being affected by cable wiring of the camera 70.

The second embodiment has been described with the configuration example in which the external cooling unit 60 is disposed on the box-type single-lens camera; however, the external cooling unit can be applied to other imaging devices and electronic devices, and in such imaging devices and electronic devices, each heat-generating component can efficiently be cooled even in a configuration in which multiple heat-generating components are mounted on multiple circuit boards in a distributed manner, so that reductions in size and weight, a higher functionality, and ease of handling can be achieved.

The embodiments have been described as exemplification of the techniques in the present disclosure. The accompanying drawings and the detailed description have been disclosed for this purpose. Therefore, the constituent elements described in the detailed description and the accompanying drawings may include constituent elements not essential for solving the problem. Thus, even though these non-essential constituent elements are included in the detailed description and the accompanying drawings, these non-essential constituent elements should not immediately be recognized as being essential.

Since the embodiments described above are intended to illustrate the techniques in the present disclosure, various modifications, replacements, additions, omissions, etc. can be made within the claims and the scope equivalent thereto.

The present disclosure provides an imaging device having high market value capable of efficiently cooling each heat-generating component even in a configuration in which multiple heat-generating components are mounted on multiple circuit boards in a distributed manner and capable of achieving reductions in size and weight, a higher functionality, and ease of handling.

What is claimed is:

1. An imaging device comprising:
   a housing including an intake port and a discharge port and at least partially made up of a heat dissipation member;
   an imaging sensor for converting light into an electrical signal disposed inside the housing;
   a first circuit board disposed inside the housing and on which a first heat-generating component for processing a signal from the imaging sensor is mounted;
   a first heat dissipation plate for transferring heat from the first heat-generating component to the housing; and
   a fan disposed adjacent to the first heat dissipation plate, taking in outside air through the intake port, air-cooling the first heat dissipation plate with the taken-in outside air, and blowing out the air from the discharge port, wherein the first heat dissipation plate is provided with a heat sink, the fan takes in the air in a rotation axis direction and discharges the air in an outer circumferential direction, and wherein the discharged air is blown to heat dissipation fins of the heat sink and discharged from the discharge port, the intake port, a fan discharge port of the fan, the heat dissipation fins of the heat sink, and the discharge port are linearly arranged in a direction orthogonal to the rotation axis of the fan inside the housing so that the air taken in from the intake port is linearly discharged toward the discharge port, and the fan and the heat sink do not overlap in the rotation axis direction.

2. The imaging device according to claim 1, comprising a second heat-generating component mounted on the first circuit board and mounted on a surface different from the first heat-generating component, and a second heat dissipation plate for transferring heat from the second heat-generating component to the housing.

3. The imaging device according to claim 1, comprising a second circuit board disposed side by side with the first circuit board inside the housing and equipped with a third heat-generating component, and a third heat dissipation plate for transferring heat from the third heat-generating component to the housing.

4. An imaging device comprising:

a housing including an intake port and a discharge port and at least partially made up of a heat dissipation member;

an imaging sensor for converting light into an electrical signal disposed inside the housing;

a first circuit board disposed inside the housing and on which a first heat-generating component for processing a signal from the imaging sensor is mounted;

a first heat dissipation plate for transferring heat from the first heat-generating component to the housing; and a fan disposed adjacent to the first heat dissipation plate, taking in outside air through the intake port, air-cooling the first heat dissipation plate with the taken-in outside air, and blowing out the air from the discharge port, wherein a partition plate of a fan duct cover is disposed between the fan and the imaging sensor, wherein the imaging sensor, the partition plate of the fan duct cover, the fan, and the first circuit board are arranged in this order, and the first heat dissipation plate is disposed between the fan and the first circuit board so that the air moved by the fan is prevented from flowing into an arrangement region of the imaging sensor by the partition plate of the fan duct cover.

5. An imaging device comprising:

a housing including an intake port and a discharge port and at least partially made up of a heat dissipation member;

an imaging sensor for converting light into an electrical signal disposed inside the housing;

a first circuit board disposed inside the housing and on which a first heat-generating component for processing a signal from the imaging sensor is mounted;

a first heat dissipation plate for transferring heat from the first heat-generating component to the housing; and a fan disposed adjacent to the first heat dissipation plate, taking in outside air through the intake port, air-cooling the first heat dissipation plate with the taken-in outside air, and blowing out the air from the discharge port, wherein the imaging device is provided with an external cooling unit attached to at least a portion of the housing made up of the heat dissipation member and including a thermoelectric element serving as a heat-absorbing surface and a heat-generating surface when an electric current is applied, wherein air from the heat-absorbing surface is supplied to the intake port and cools at least a portion of the housing made up of the heat dissipation member, and wherein the air from the heat-generating surface is not supplied to the intake port.

6. The imaging device according to claim 5, wherein the air from the heat-absorbing surface comes into contact with the surface of the housing provided with the intake port and the other surfaces constituting the housing.

7. The imaging device according to claim 5, wherein the external cooling unit is configured not to cover a surface including various terminals arranged in the housing.

* * * * *